(12) United States Patent
Chen

(10) Patent No.: US 11,823,950 B2
(45) Date of Patent: Nov. 21, 2023

(54) MEMORY DEVICE

(71) Applicant: Winbond Electronics Corp., Taichung (TW)

(72) Inventor: Huang-Nan Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 328 days.

(21) Appl. No.: 17/093,635

(22) Filed: Nov. 10, 2020

(65) Prior Publication Data

US 2021/0082741 A1 Mar. 18, 2021

Related U.S. Application Data

(62) Division of application No. 16/365,681, filed on Mar. 27, 2019, now Pat. No. 10,872,811.

(51) Int. Cl.

| H01L 23/532 | (2006.01) |
| H01L 23/528 | (2006.01) |
| H01L 21/768 | (2006.01) |
| H01L 21/311 | (2006.01) |
| H01L 21/02 | (2006.01) |
| H01L 21/285 | (2006.01) |
| H01L 21/3213 | (2006.01) |
| H01L 21/762 | (2006.01) |
| H01L 21/3105 | (2006.01) |
| H10B 12/00 | (2023.01) |

(52) U.S. Cl.
CPC ...... *H01L 21/7682* (2013.01); *H01L 21/0217* (2013.01); *H01L 21/0228* (2013.01); *H01L 21/02164* (2013.01); *H01L 21/02271* (2013.01); *H01L 21/28525* (2013.01); *H01L 21/28568* (2013.01); *H01L 21/31053* (2013.01); *H01L 21/31111* (2013.01); *H01L 21/32134* (2013.01); *H01L 21/76224* (2013.01); *H01L 21/76819* (2013.01); *H01L 23/5283* (2013.01); *H01L 23/5329* (2013.01); *H01L 23/53266* (2013.01); *H01L 23/53271* (2013.01); *H10B 12/30* (2023.02); *H10B 12/482* (2023.02); *H10B 12/488* (2023.02)

(58) Field of Classification Search
None
See application file for complete search history.

(56) References Cited

U.S. PATENT DOCUMENTS

| 2014/0179092 A1* | 6/2014 | Kim | H01L 27/228 438/586 |
| 2014/0264953 A1* | 9/2014 | Lim | H01L 21/7682 257/786 |
| 2014/0308794 A1* | 10/2014 | Lee | H01L 23/498 438/653 |
| 2015/0014759 A1* | 1/2015 | Lee | H01L 23/5226 257/306 |
| 2015/0035050 A1* | 2/2015 | Yeom | H01L 21/76877 257/532 |
| 2018/0226410 A1* | 8/2018 | Chang | H01L 27/10888 |
| 2019/0103302 A1* | 4/2019 | Yoon | H01L 21/76805 |

* cited by examiner

*Primary Examiner* — Evren Seven
(74) *Attorney, Agent, or Firm* — JCIPRNET

(57) ABSTRACT

Provided is a memory device including a substrate, a plurality of contacts, and a plurality of air gaps. The substrate has a plurality of active areas. The contacts are respectively disposed on ends of the active areas. The air gaps respectively surround the sidewalls of the contacts.

13 Claims, 26 Drawing Sheets

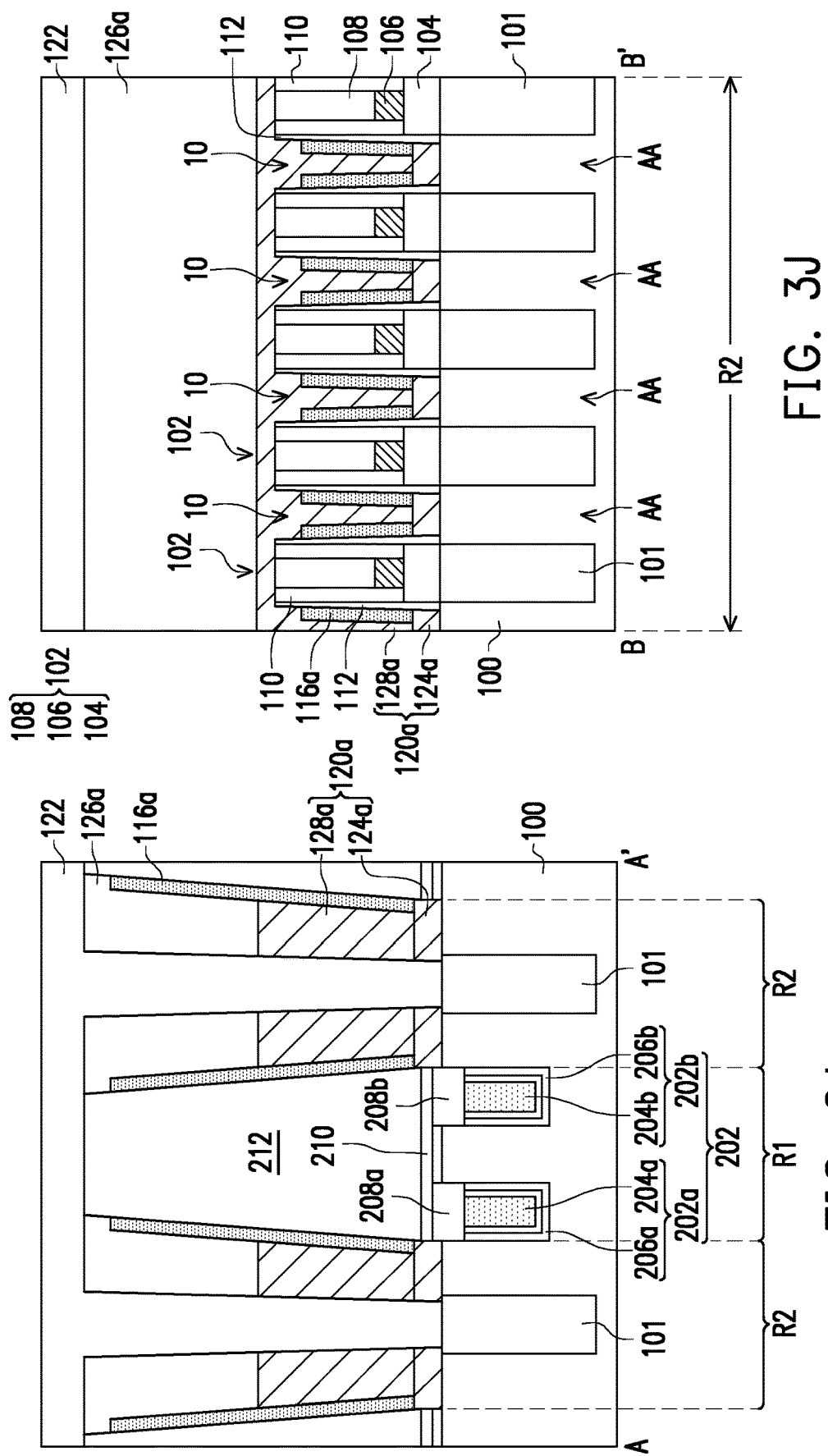

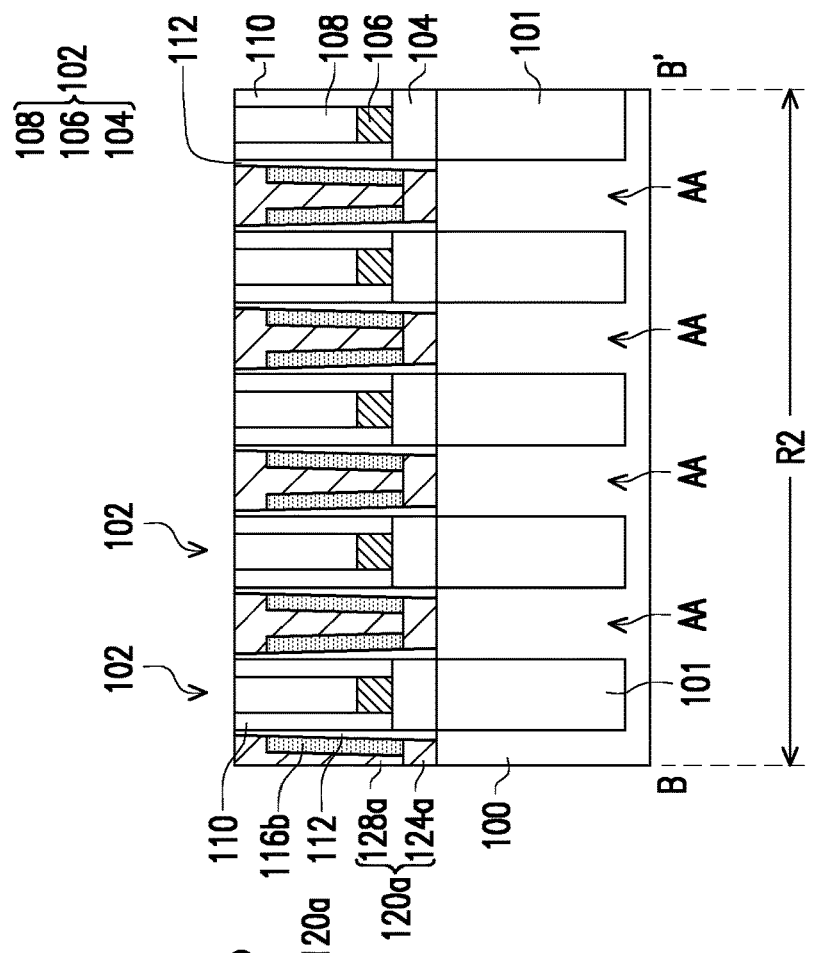
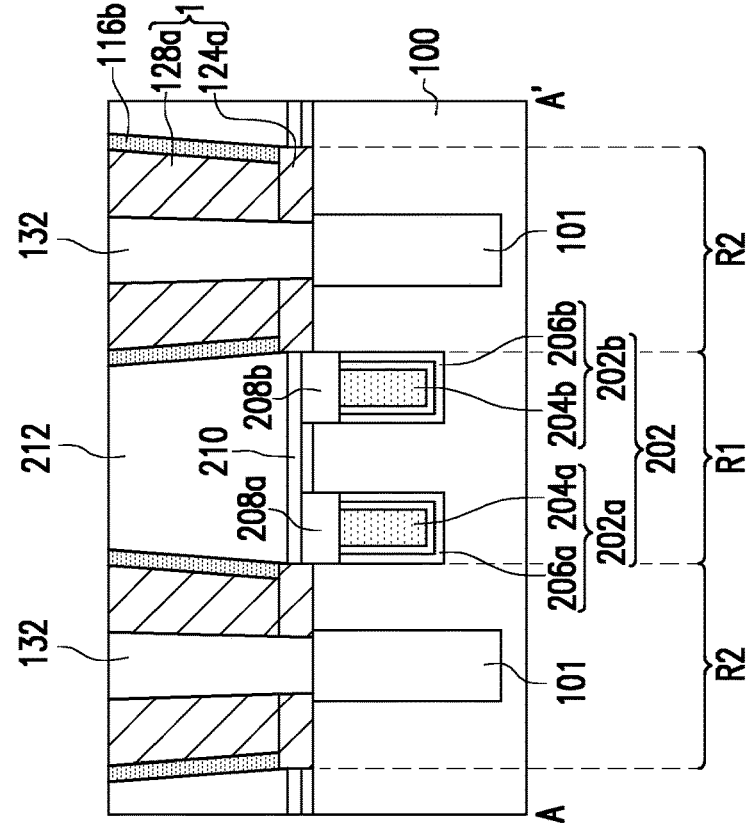
FIG. 3K
FIG. 2K

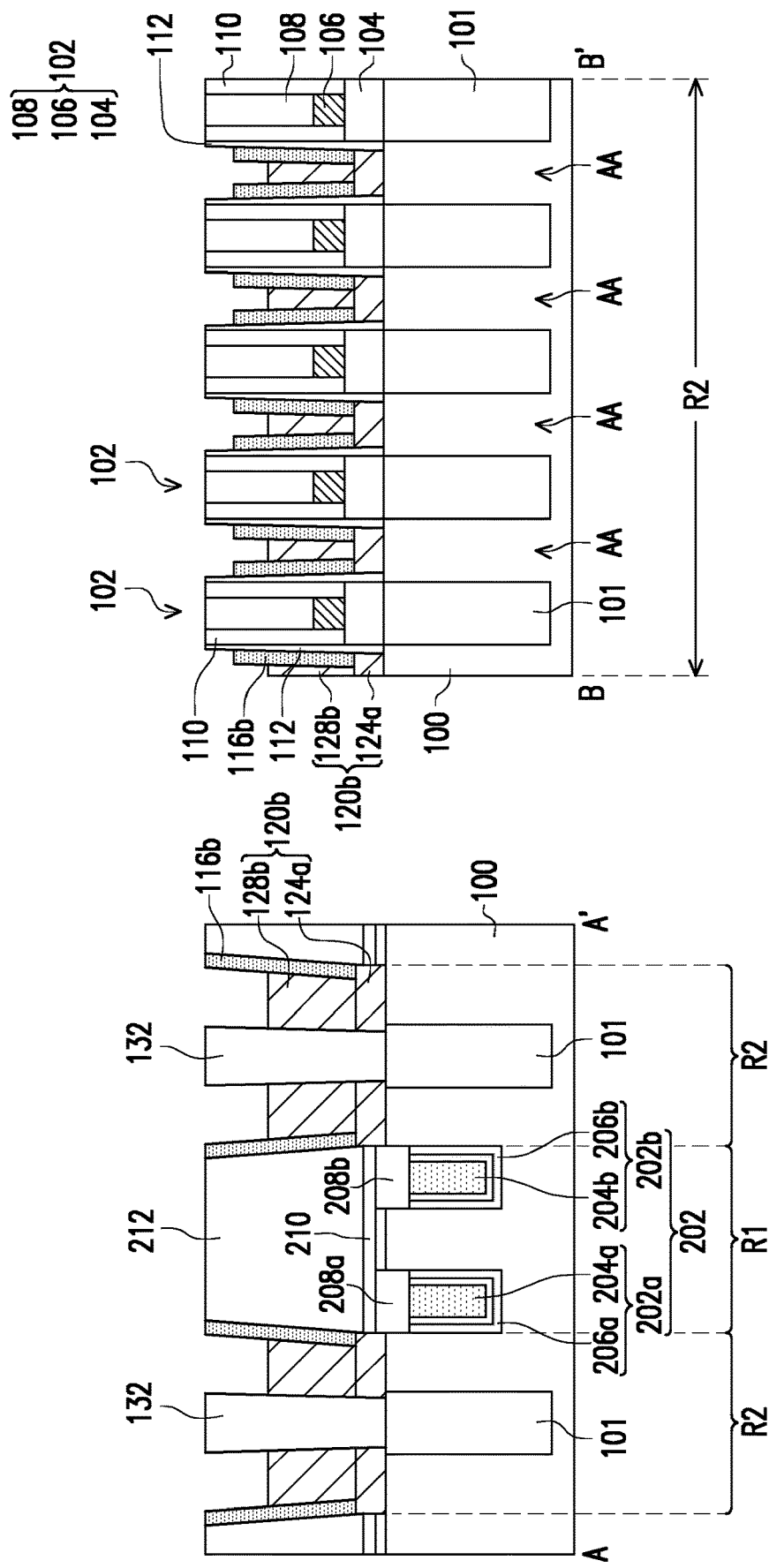

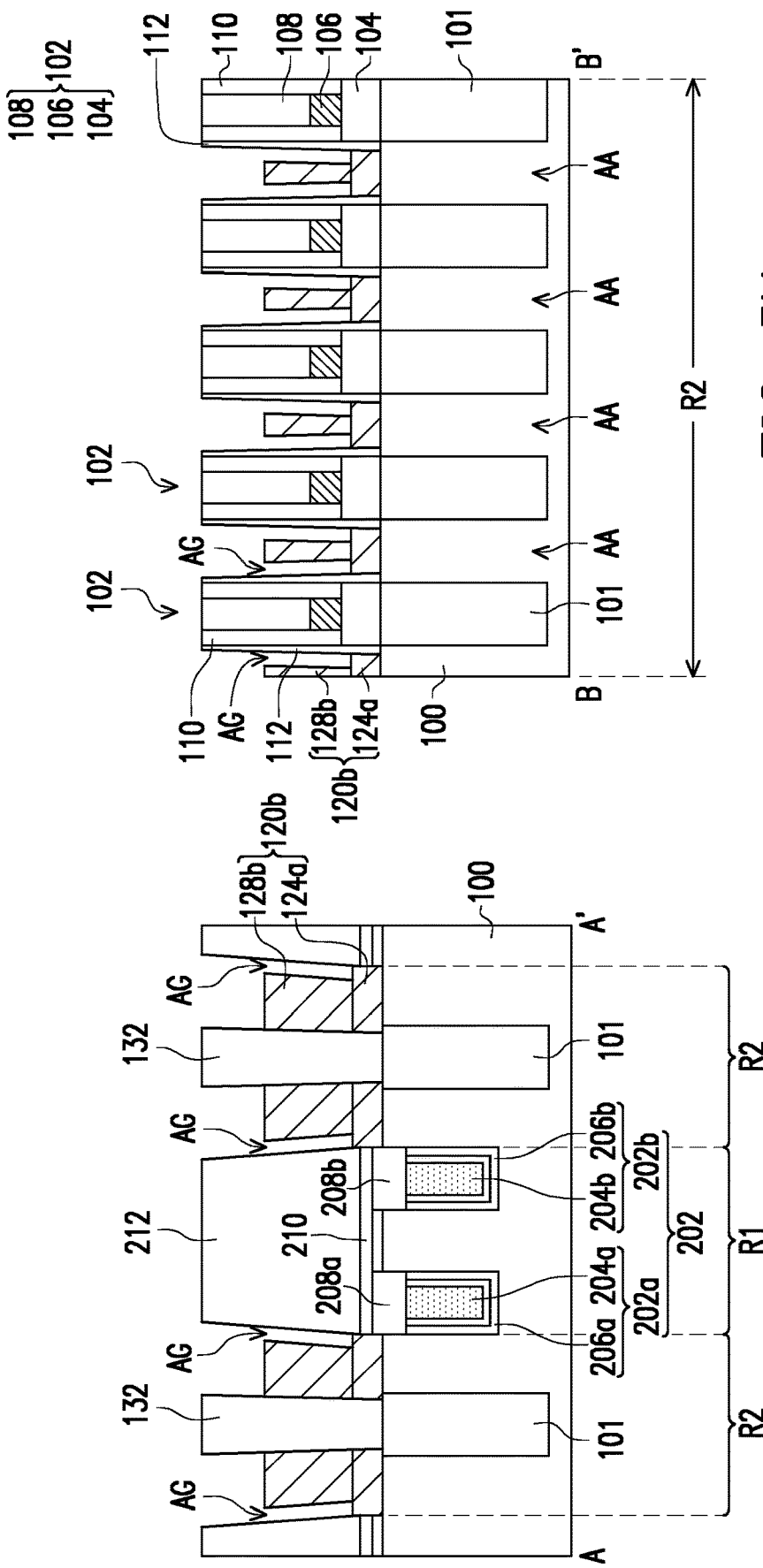

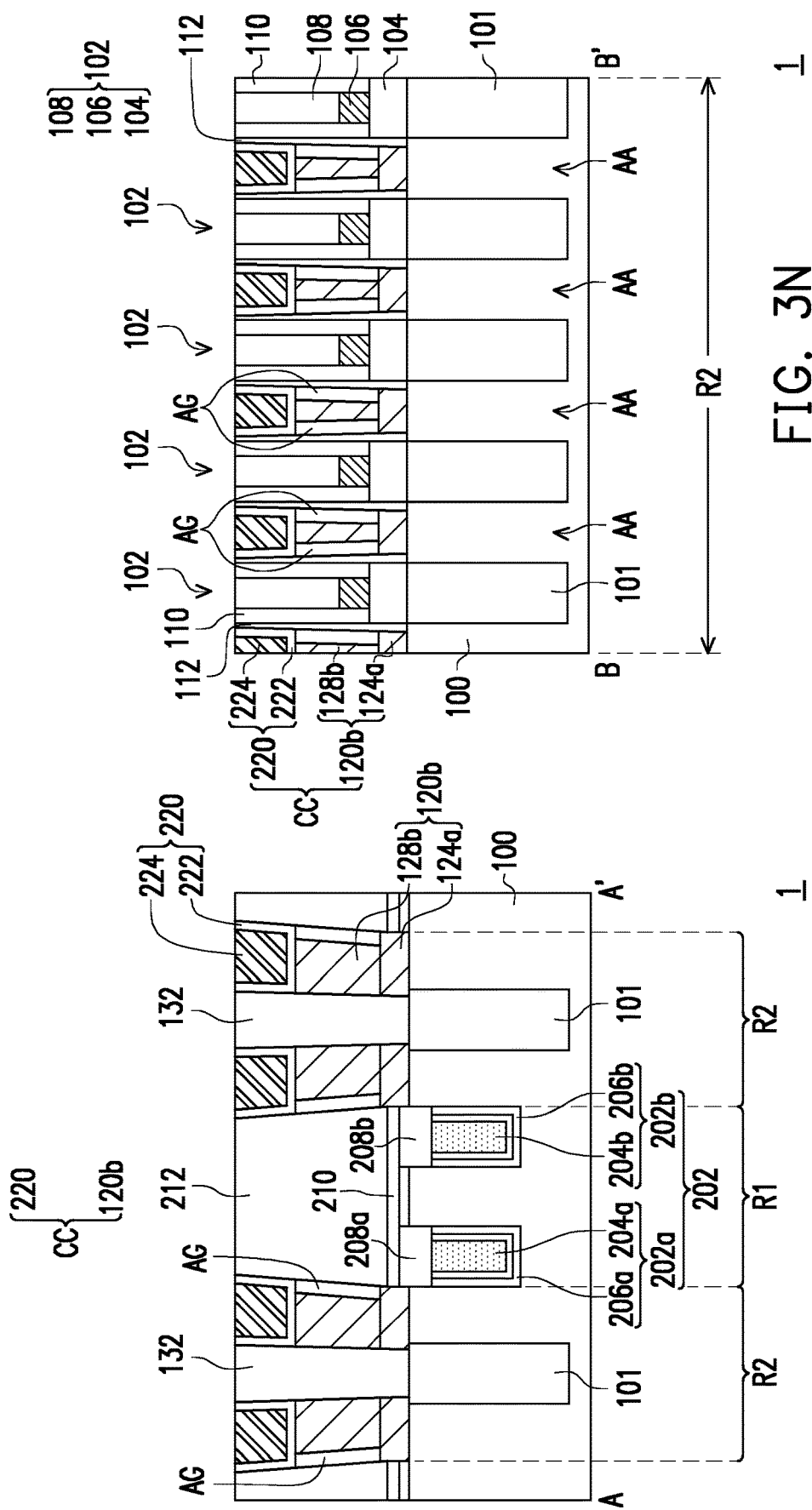

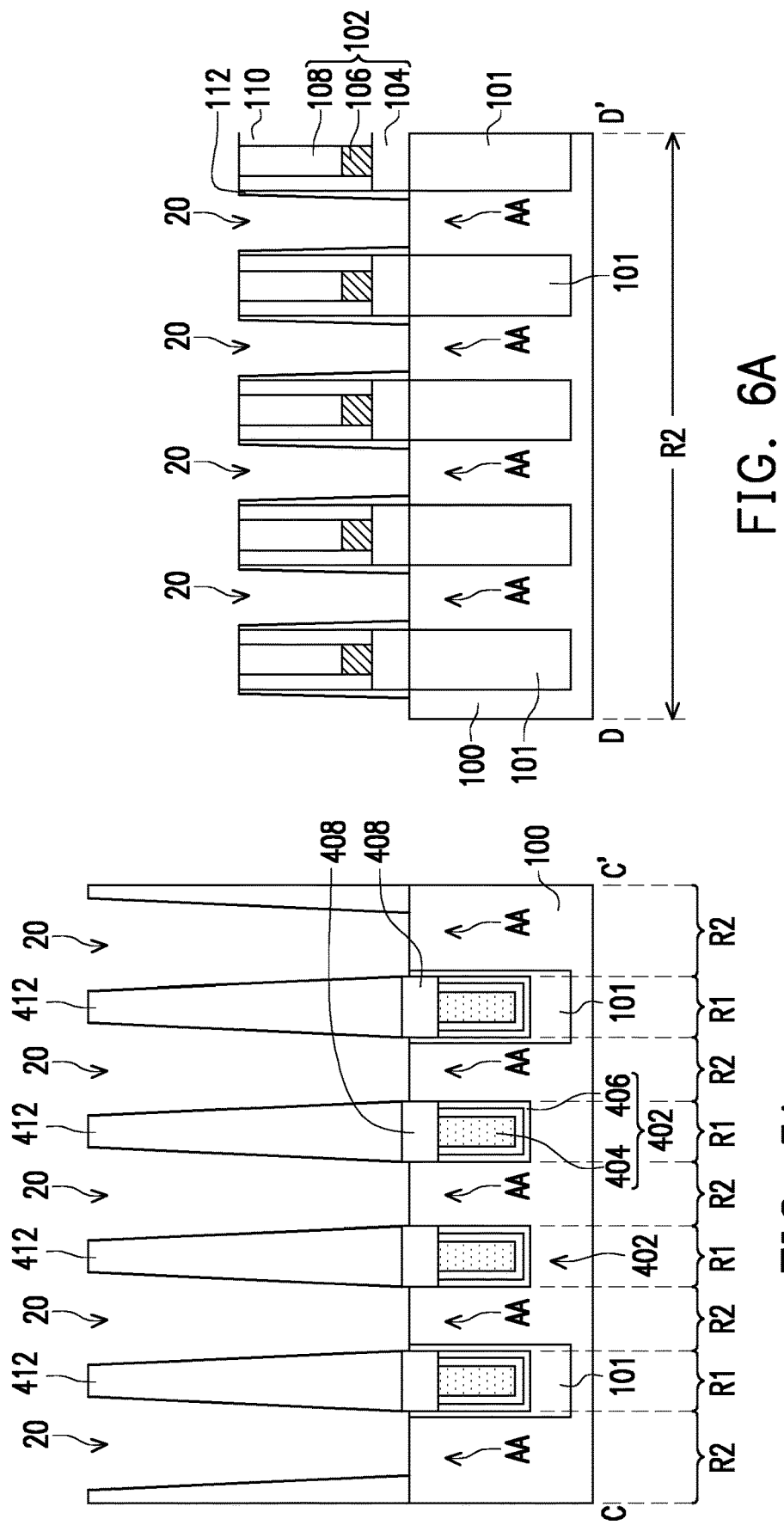

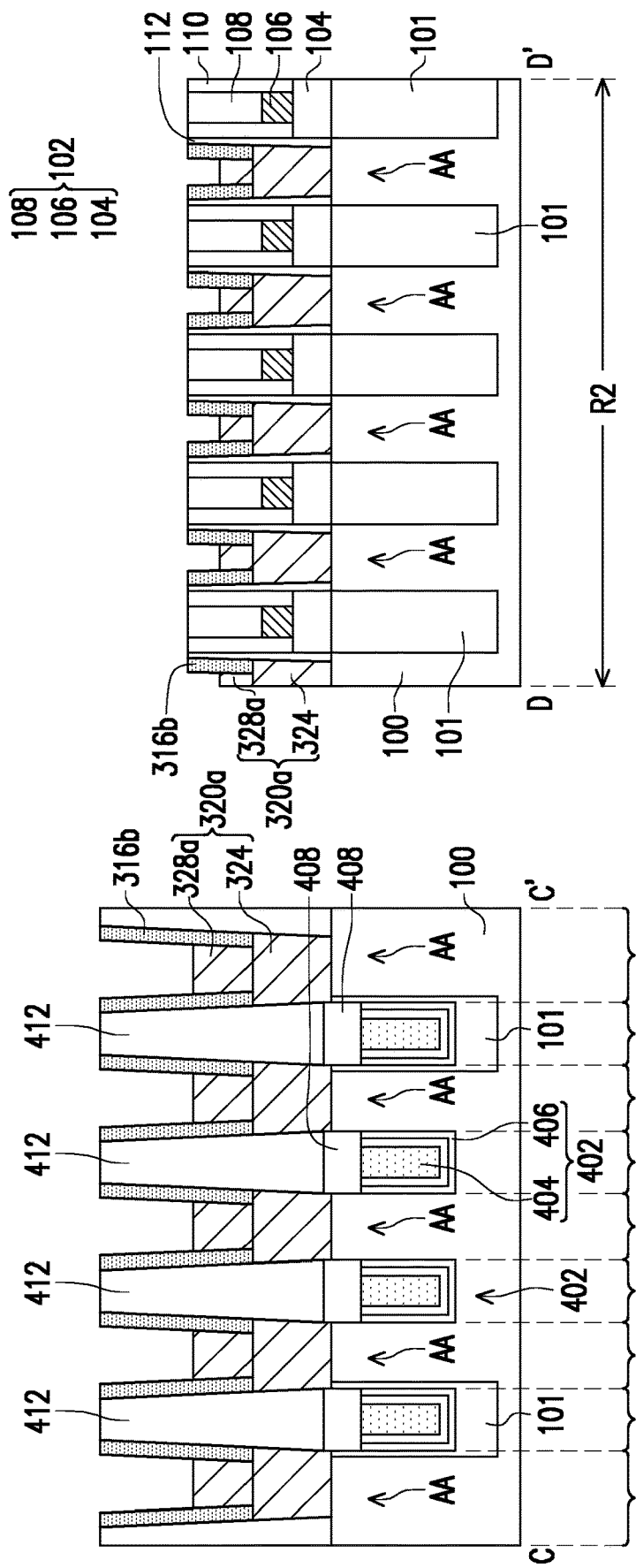

MEMORY DEVICE

CROSS-REFERENCE TO RELATED APPLICATION

This application is a divisional application of and claims the priority benefit of U.S. application Ser. No. 16/365,681, filed on Mar. 27, 2019, now allowed. The entirety of each of the above-mentioned patent applications is hereby incorporated by reference herein and made a part of this specification.

BACKGROUND OF THE INVENTION

Field of the Invention

The invention relates to a semiconductor device and a manufacturing method thereof, and more particularly, to a memory device and a manufacturing method thereof.

Description of Related Art

Dynamic random-access memory (DRAM) is a type of volatile memory, wherein each memory cell thereof is mainly composed of one transistor and one capacitor controlled by the transistor and is electrically connected to the corresponding bit line and word line.

With the advancement of technology, all types of electronic products are developed to be lightweight and compact. However, under this trend, the critical dimension of DRAM is also shrinking, which leads to an increase in the capacitance between the bit lines and the contacts, thereby resulting in a slower resistance-capacitance delay (RC delay), which in turn affects the operating speed of the device.

SUMMARY OF THE INVENTION

The invention provides a memory device and a manufacturing method thereof having air gaps surrounding the contacts to reduce the capacitance between the bit lines and the contacts, thereby increasing the operating speed of the memory device.

The invention provides a memory device including a substrate, a plurality of contacts, and a plurality of air gaps. The substrate has a plurality of active areas. The contacts are respectively disposed on ends of the active areas. The air gaps respectively surround the sidewalls of the contacts.

The invention provides a manufacturing method of a memory device including the following steps. A substrate having a plurality of first regions and a plurality of second regions is provided. A plurality of word line sets are formed in the first regions. A first dielectric layer is formed on the substrate of the first regions. A conductive layer is formed on the substrate of the second regions, wherein a top surface of the conductive layer is lower than a top surface of the first dielectric layer. A sacrificial layer is formed to surround the conductive layer. A second dielectric layer is conformally formed on the substrate. An etching process is performed to form openings in the conductive layer and the second dielectric layer of the second regions, wherein the openings expose a first isolation structure in the substrate of the second regions. A second isolation structure is formed in the openings. A planarization process is performed to expose the sacrificial layer. A portion of the conductive layer is recessed to form a first conductive structure and expose the sacrificial layer. The sacrificial layer is removed to form an air gap surrounding an upper portion of the first conductive structure. A second conductive structure is formed on the first conductive structure to encapsulate the air gap.

The invention provides another manufacturing method of a memory device including the following steps. A substrate having a plurality of active areas is provided. A first dielectric layer is formed on the substrate. A plurality of contact openings are formed in the first dielectric layer, and the contact openings are respectively disposed at ends of the active areas. A plurality of conductive layers are respectively formed in the contact openings. A sacrificial layer is formed to surround the conductive layers. A portion of the conductive layers is recessed to form first conductive structures. The sacrificial layer is removed to form air gaps surrounding the upper portions of the first conductive structures. A second conductive structure is formed on the first conductive structures to encapsulate the air gaps.

Based on the above, the memory device of the invention includes air gaps surrounding the sidewalls of the contacts, which is able to reduce the capacitance between the bit lines and the contacts and reduce the RC delay, thereby increasing the operating speed of the memory device.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5A to FIG. 5J are cross-sectional views of the manufacturing process of the memory device of FIG. 4 along line C-C'.

FIG. 6A to FIG. 6J are cross-sectional views of the manufacturing process of the memory device of FIG. 4 along line D-D'.

DESCRIPTION OF THE EMBODIMENTS

Figure 1:
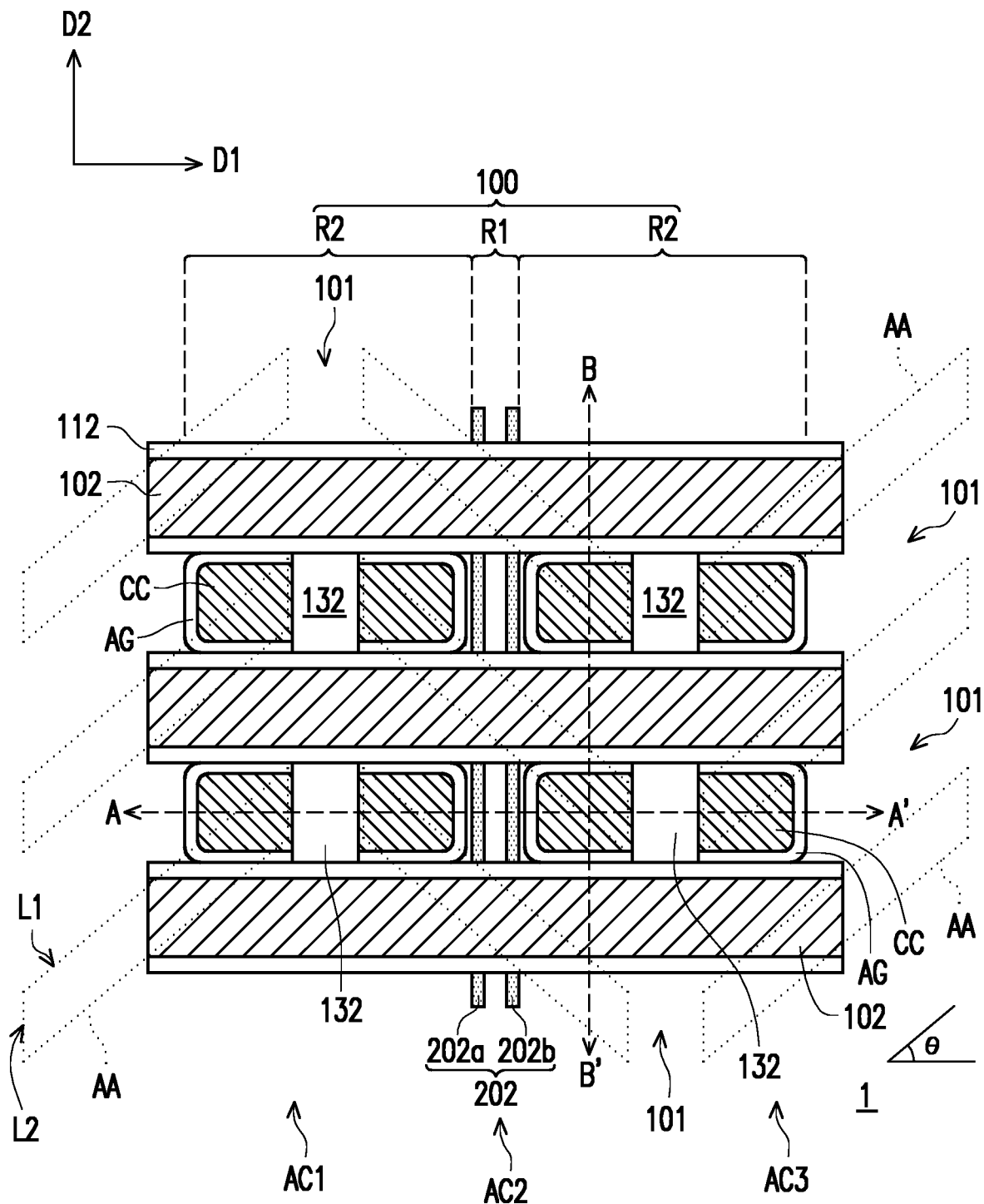
FIG. 1 is a top view of a memory device of the first embodiment of the invention.

The invention is more comprehensively described with reference to the figures of the present embodiments. However, the invention may also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Referring to FIG. 1, the present embodiment provides a memory device 1 including a substrate 100, isolation structures 101, a plurality of active areas AA, a plurality of bit line structures 102, a plurality of word line sets 202, and a plurality of capacitor contacts CC. For the sake of clarity of the drawing, FIG. 1 only shows the above-mentioned members, and other structures may be seen in the subsequent cross-sectional views of FIGS. 2A to 2N and FIGS. 3A to 3N.

As shown in FIG. 1, the substrate 100 includes a plurality of first regions R1 and a plurality of second regions R2. The first regions R1 and the second regions R2 are alternately arranged along a first direction D1. The isolation structures 101 are disposed in the substrate 100 to define the substrate 100 as a plurality of active areas AA. In other words, the isolation structure 101 is included between two adjacent active areas AA. In an embodiment, only single memory cell is formed on single active area AA, and the memory cells are respectively separated by the isolation structures 101 to effectively reduce interference between the memory cells. Specifically, the active areas AA are disposed as strips and arranged in an array. In the present embodiment, the active areas AA are arranged as three active area columns (AC1 to AC3), and adjacent active area columns are arranged in a mirrored configuration. For example, a long-side direction of the active area column AC3 is non-orthogonal with the first direction D1 and an angle θ is included between the two directions, and a long-side direction of the active area column AC2 is non-orthogonal with the first direction D1 and an angle (180°-θ) is included between the two directions. The angle θ may be between 15 degrees and 75 degrees. In other embodiments, two adjacent active area columns may also be arranged in a same configuration.

The bit line structures 102 are located on the substrate 100 and traverse or across the first regions R1 and the second regions R2. The bit line structures 102 are extended along the first direction D1 and are alternately arranged along a second direction D2. The word line sets 202 are located in the substrate 100 of the first regions R1. The word line sets 202 are extended along the second direction D2 and alternately arranged along the first direction D1. Each of the word line sets 202 has two embedded word lines 202a and 202b. In an embodiment, the first direction D1 and the second direction D2 are different and substantially perpendicular to each other.

In the present embodiment, each of the active areas AA has a long side L1 and a short side L2, and the long side L1 traverses the corresponding word line set 202 (202a and 202b). A bit line contact (not shown) is located at an overlap region of each of the active areas AA and the corresponding bit line structure 102. Therefore, each of the bit line structures 102 may be electrically connected to the corresponding doped region (not shown) through the bit line contact when traversing the corresponding word line set 202, wherein the doped region is between the two embedded word lines 202a and 202b.

As shown in FIG. 1, the capacitor contacts CC are respectively disposed on the two ends of the long side L1 of the active areas AA, and are electrically connected to the active areas AA and the subsequently formed capacitor (not shown). From another point of view, one of the bit line structures 102 is disposed between the capacitor contacts CC at two ends of the long side L1 of the active area AA. One of the word line sets 202 is disposed in the substrate 100 between two adjacent capacitor contacts CC in the laterally direction (i.e., the first direction D1). Moreover, dielectric pillars 132 (which may also be considered as isolation structures) are disposed on the substrate 100 between the bit line structures 102 to separate or electrically isolate the capacitor contacts CC on adjacent active areas AA. The dielectric pillars 132 correspond to the isolation structures 101. In some embodiments, the bottom surface area of the dielectric pillars 132 is less than or equal to the top surface area of the isolation structures 101 to ensure maximum contact areas between the capacitor contacts CC and the active areas AA.

It should be noted that the memory device 1 further includes: a plurality of air gaps AG respectively surrounding the sidewalls of the capacitor contacts CC. The air gaps AG surround three sidewalls of the capacitor contacts CC, and the other sidewall is covered by the dielectric pillars 132. As shown in FIG. 1, the air gaps AG are extended between the sidewalls of two adjacent bit line structures 102 in the longitudinal direction (i.e., the second direction D2). That is, the air gaps AG are extended from one sidewall of one bit line structure 102 to cover another sidewall of another bit line structure 102 vertically adjacent the one bit line structure 102. Since the dielectric constant of the air gaps AG approaches 1, the air gaps AG may reduce the capacitance between the bit line structures 102 and the capacitor contacts CC and reduce RC delay, thereby increasing the operating speed of the memory device 1. In addition, although the capacitor contacts CC are shown as rectangles in FIG. 1, the contacts actually formed are slightly rounded and the size thereof may be designed according to process requirements. Further, although the word line sets 202 shown in FIG. 1 are separated from the air gaps AG by a distance, the invention is not limited thereto. In other embodiments, the air gaps AG or the capacitor contacts CC may be partially overlapped with the word line sets 202 in a top view.

Figure 3A:
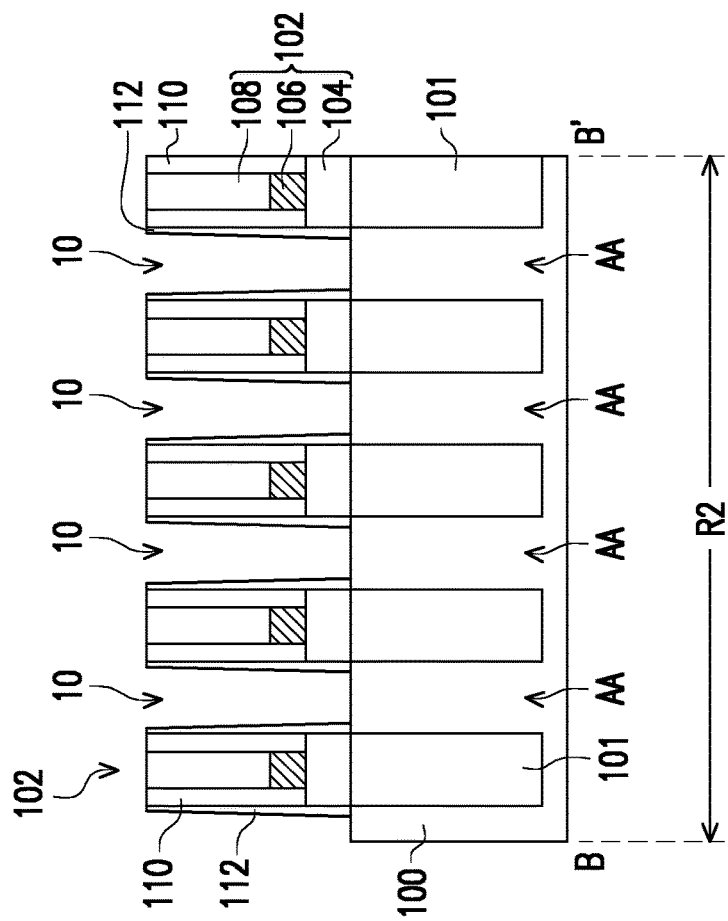
FIG. 3A to FIG. 3N are cross-sectional views of the manufacturing process of the memory device of FIG. 1 along line B-B'.
Figure 2A:
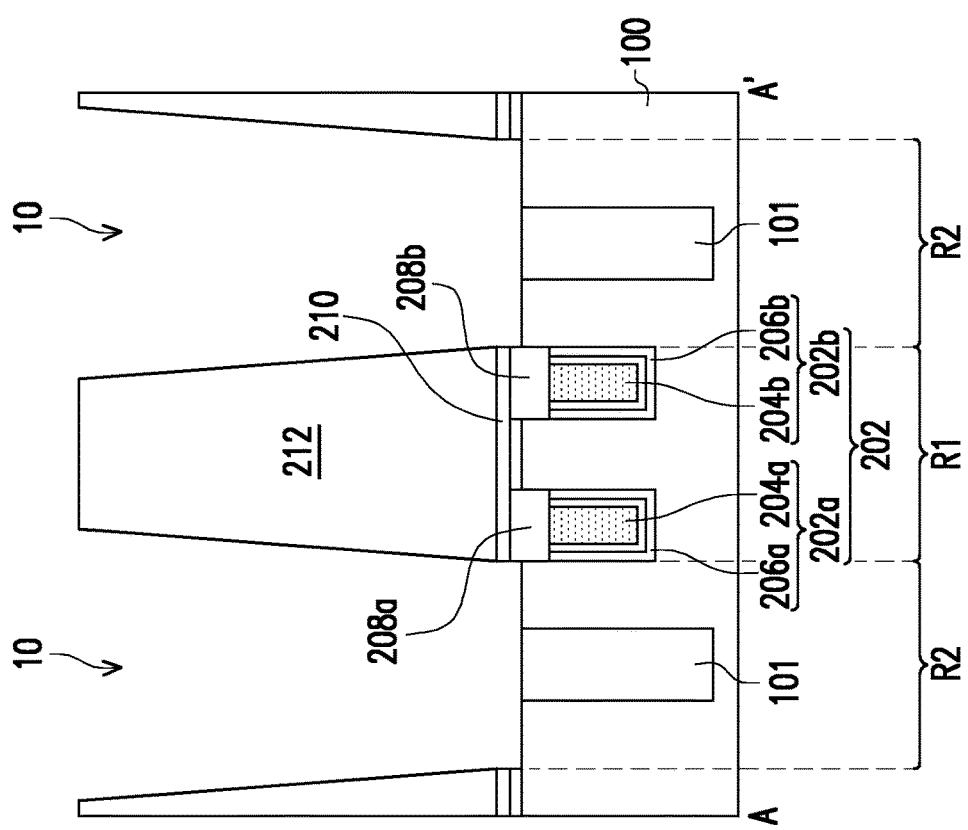
FIG. 2A to FIG. 2N are cross-sectional views of the manufacturing process of the memory device of FIG. 1 along line A-A'.

Referring to all of FIG. 1, FIG. 2A, and FIG. 3A, the present embodiment provides a manufacturing method of the memory device 1 including the following steps. First, an initial structure is provided that includes a substrate 100, isolation structures 101, and a plurality of word line sets 202.

As shown in FIG. 1 and FIG. 2A, a plurality of word line sets 202 are disposed in the substrate 100 of the first regions R1. Each of the word line sets 202 includes two embedded word lines 202a and 202b. The embedded word lines 202a and 202b include gates 204a and 204b and gate dielectric layers 206a and 206b. The gate dielectric layers 206a and 206b surround the gates 204a and 204b to electrically isolate the gates 204a and 204b from the substrate 100. In addition, the initial structure further includes dielectric layers 208a and 208b respectively disposed on the embedded word lines 202a and 202b.

As shown in FIG. 2A, a dielectric layer 212 (which may be considered as a first dielectric layer) is formed on the initial structure (or the substrate 100) of the first regions R1. A dielectric layer 210 is also included between the dielectric layer 212 and the substrate 100. In an embodiment, a material of the dielectric layers 210 and 212 includes silicon nitride, which may be formed by CVD. The dielectric layers 210 and 212 expose the substrate 100 and the isolation structures 101 of the second regions R2 to form openings 10.

Referring to FIG. 1 and FIG. 3A, a plurality of bit line structures 102 are formed on the initial structure. In FIG. 3A, the bit line structures 102 include a dielectric layer 104, a bit line 106, and a cap layer 108 from bottom to top. First spacers 110 cover sidewalls of the bit line 106 and sidewalls of the cap layer 108. Second spacers 112 cover sidewalls of the first spacers 110 and sidewalls of the dielectric layer 104. Moreover, in a cross-sectional view along the active areas AA, the bit line structures 102 include a bit line contact (not shown), the bit line 106, and the cap layer 108 from bottom to top. The bit line structures 102 may be electrically connected to the active areas AA (i.e., the source/drain doped regions) via the bit line contacts (not shown).

As shown in FIG. 3A, after the second spacers 112 are formed on the first spacers 110, a plurality of openings 10 are included between the bit line structures 102. The openings 10 at least expose the top surface of the substrate 100 (or the active areas AA). As shown in FIG. 2A and FIG. 3A, the openings 10 are defined by the substrate 100, the dielectric layers 210 and 212, and the bit line structures 102.

Figures 2B, 3B:
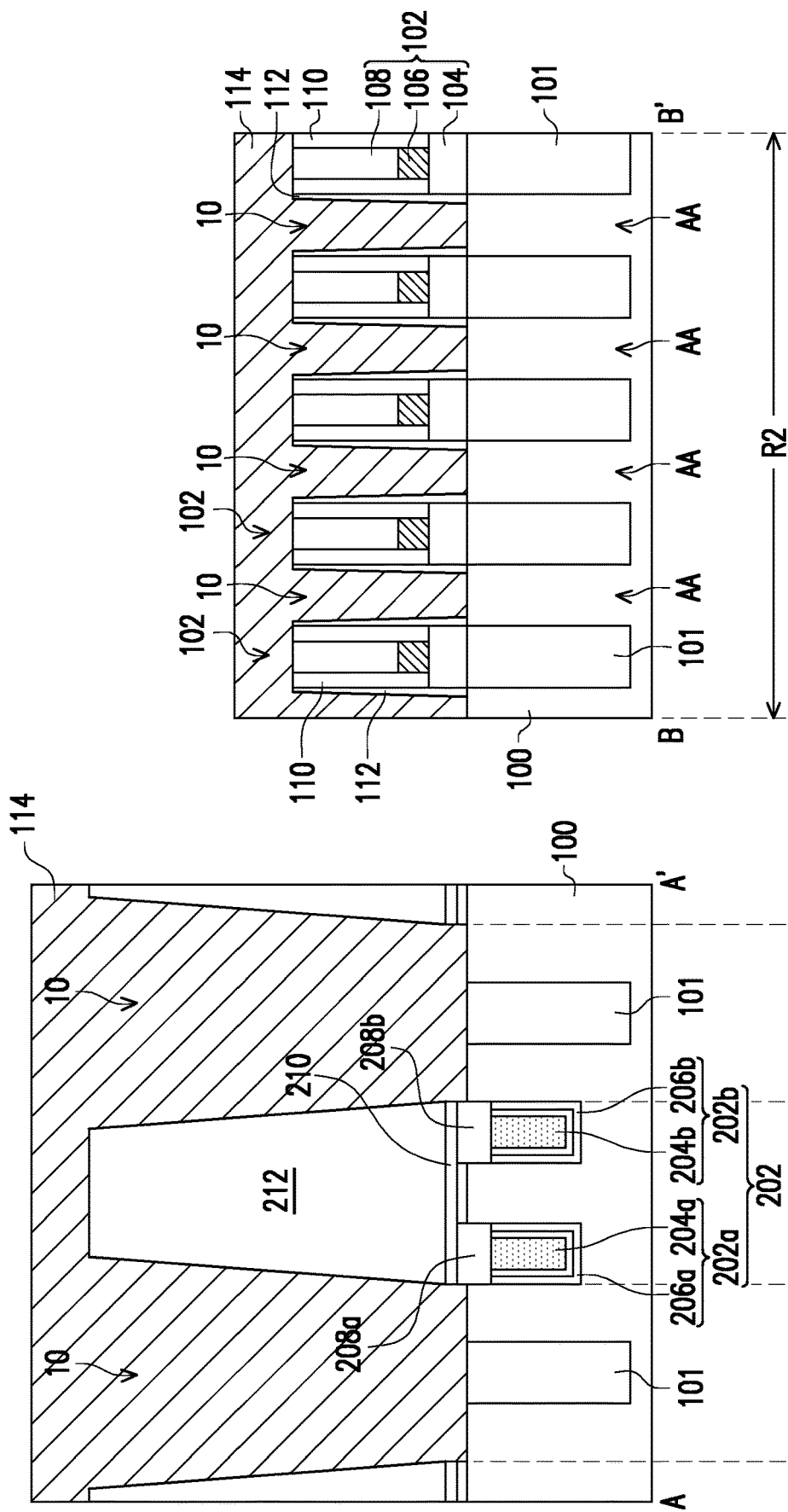

Referring to FIG. 2B and FIG. 3B, a conductive material 114 is formed on the initial structure (or the substrate 100). The conductive material 114 is filled in the openings 10 and extended to cover the top surfaces of the bit line structures 102 and the top surface of the dielectric layer 212.

Figure 3C:
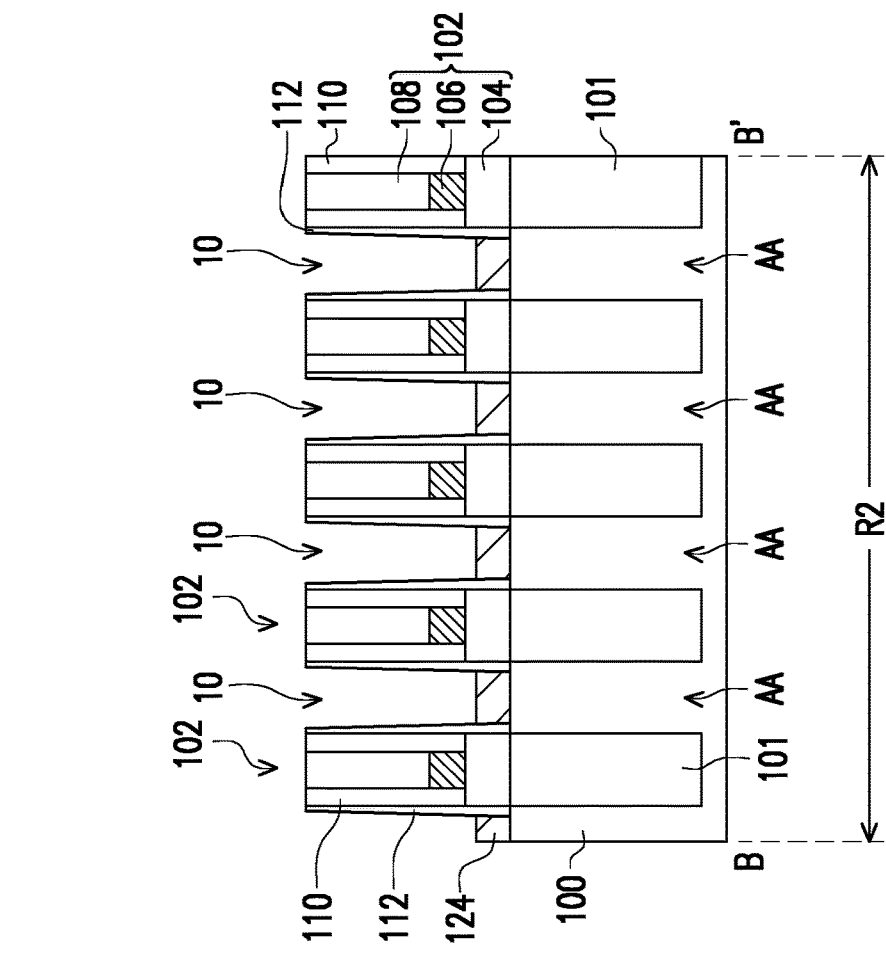

Referring to FIGS. 2B to 2C and FIGS. 3B to 3C, an etching back process is performed to remove a portion of the conductive material 114 to form a thinner conductive material 124 (which may be regarded as a first conductive material) in the openings 10. In an embodiment, as shown in FIG. 3C, the top surface of the conductive material 124 is lower than the bottom surface of the bit line 106. In other embodiments, the top surface of the conductive material 124 is between the bottom surface of the bit line 106 and the top surface of the substrate 100.

Figure 2C:
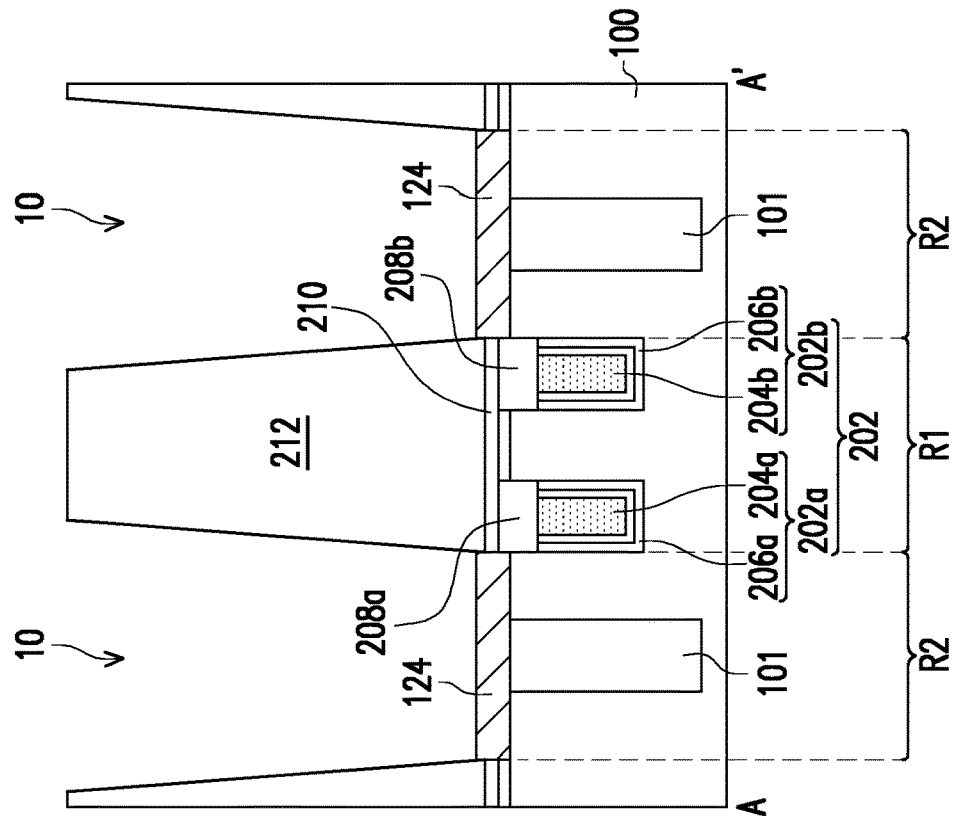
Figures 2D, 3D:
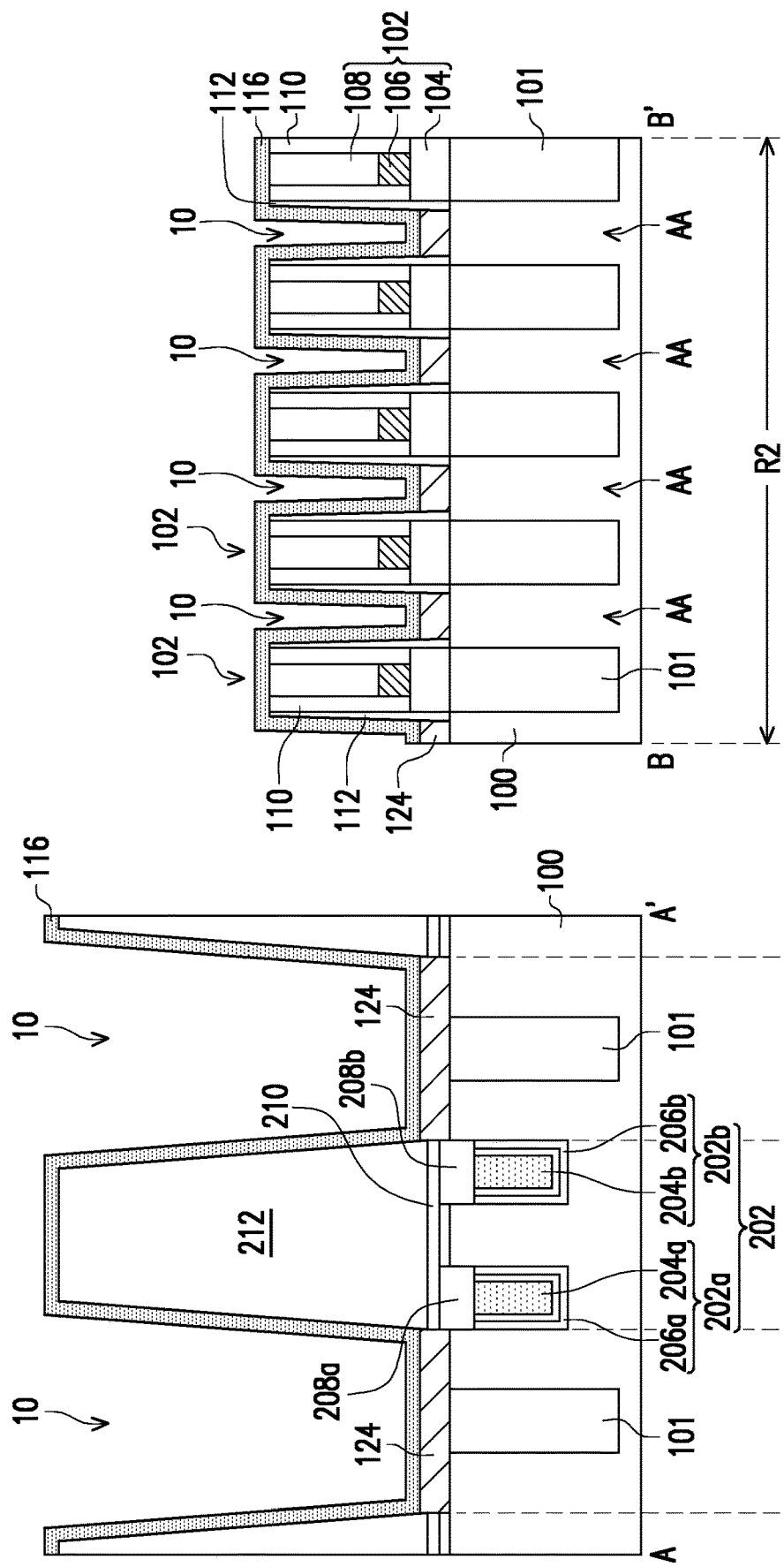

Referring to FIG. 2D and FIG. 3D, a sacrificial material 116 is formed on the substrate 100. The sacrificial material 116 conformally covers the dielectric layer 212, the bit line structures 102, and the conductive material 124. In an embodiment, a material of the sacrificial material 116 includes silicon oxide, which may be formed by atomic layer deposition (ALD).

Figure 3E:
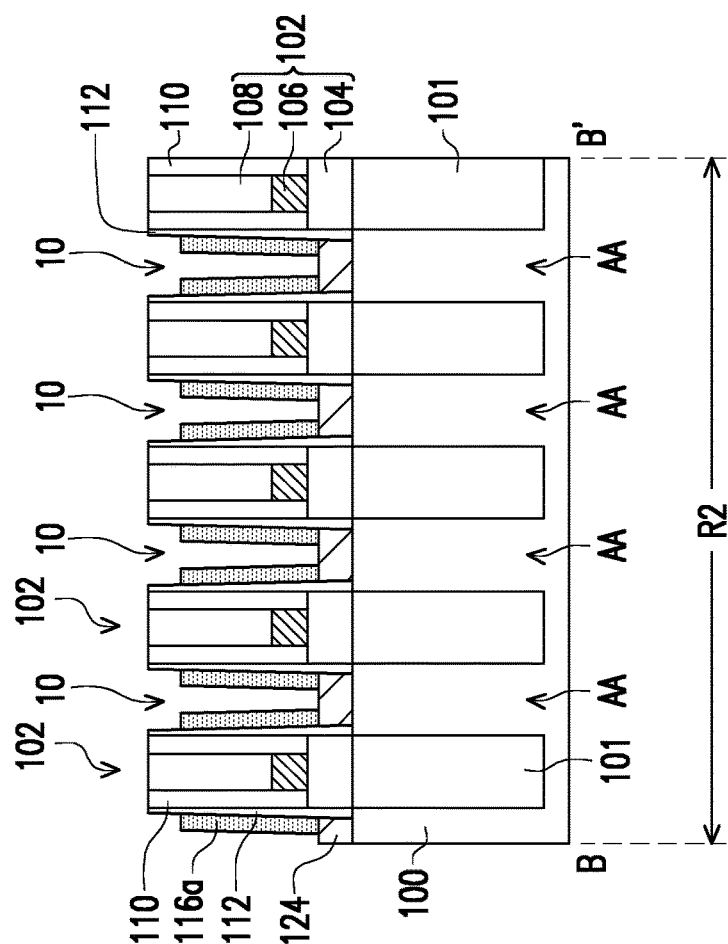
Figure 2E:
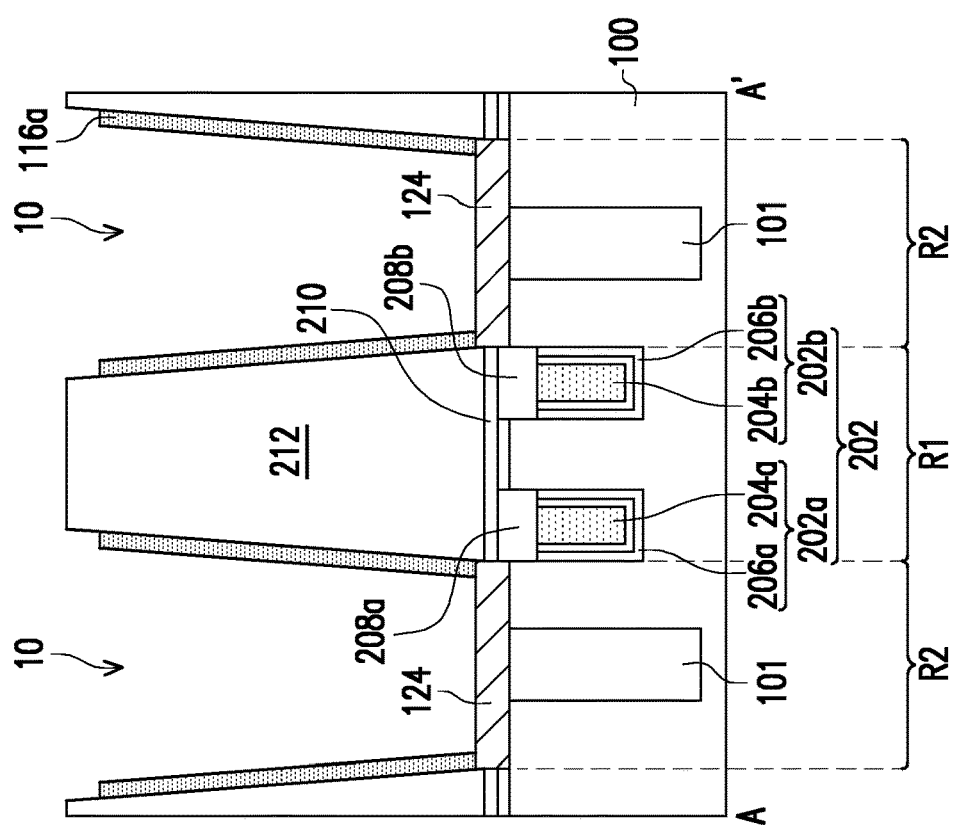

Referring to FIGS. 2D to 2E and FIGS. 3D to 3E, another etching back process is performed to remove a portion of the sacrificial material 116 to expose the top surface of the conductive material 124 and the top surface of the dielectric layer 212. In this case, as shown in FIG. 2E and FIG. 3E, a remaining sacrificial material 116a (hereinafter referred to as a sacrificial layer 116a) is disposed on the conductive material 124 and extended along the sidewalls of the openings 10.

Figure 3F:
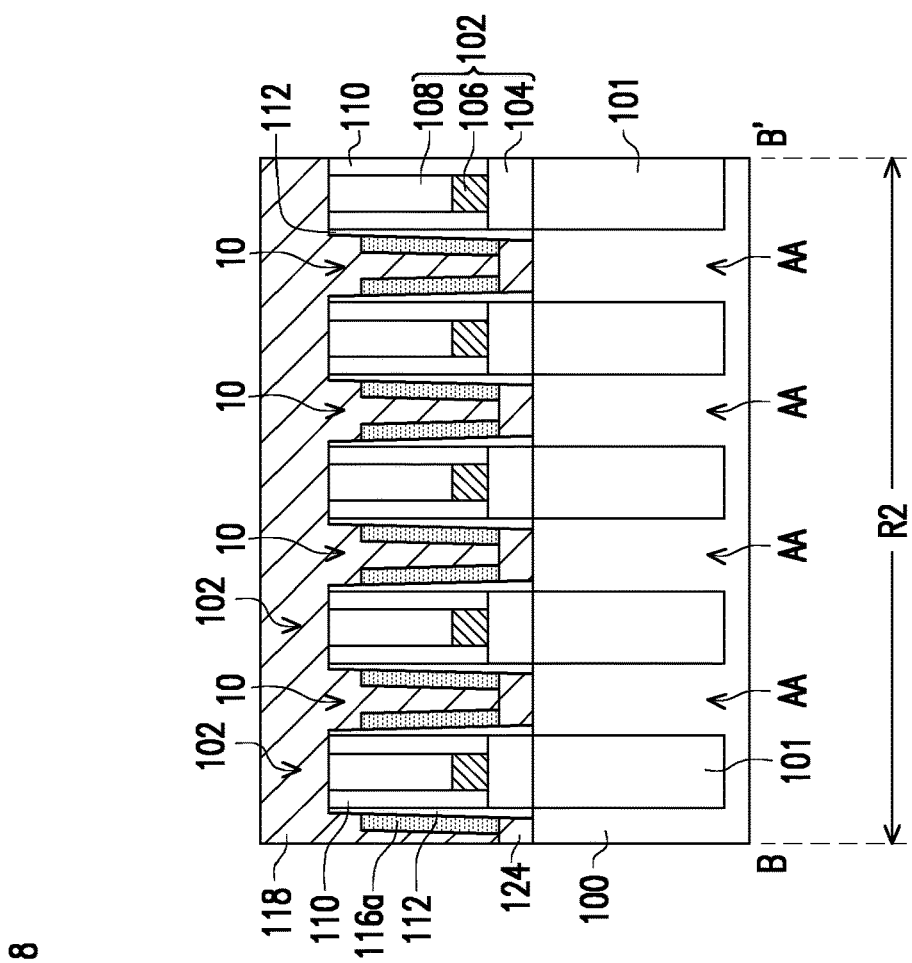
Figure 2F:
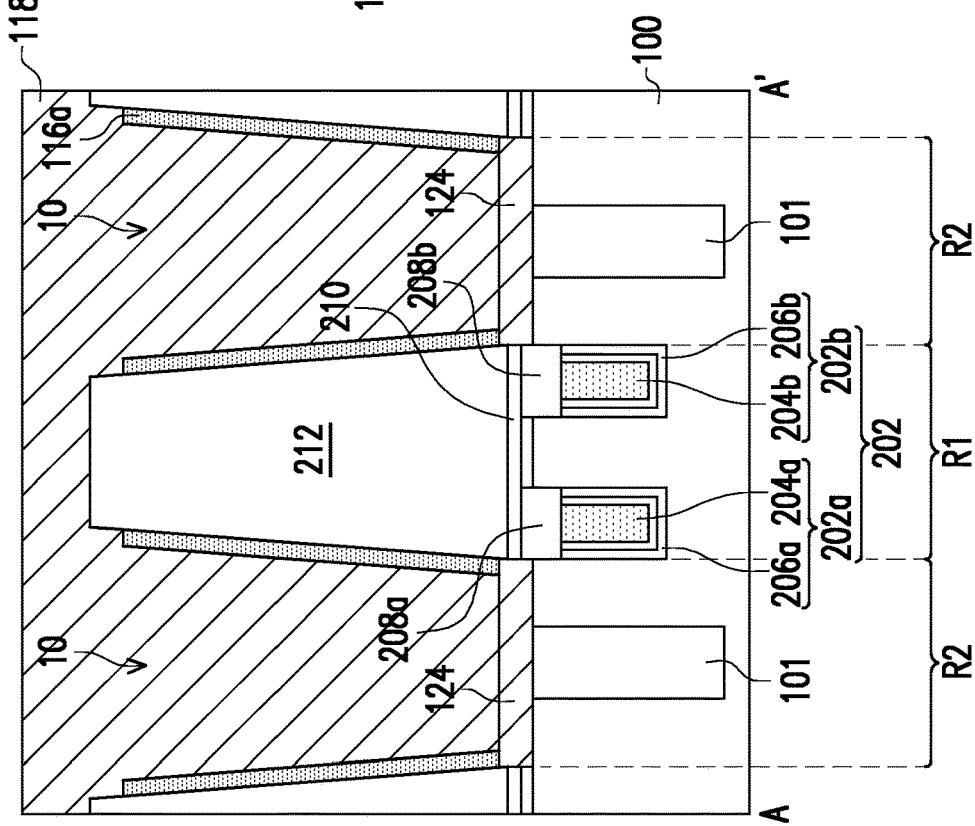

Referring to FIG. 2F and FIG. 3F, a conductive material 118 is formed on the conductive material 124. Specifically, the conductive material 118 is filled in the openings 10 and extended to cover the top surfaces of the bit line structures 102 and the top surface of the dielectric layer 212. The conductive material 118 may be polysilicon which may be formed by CVD.

Figure 3G:
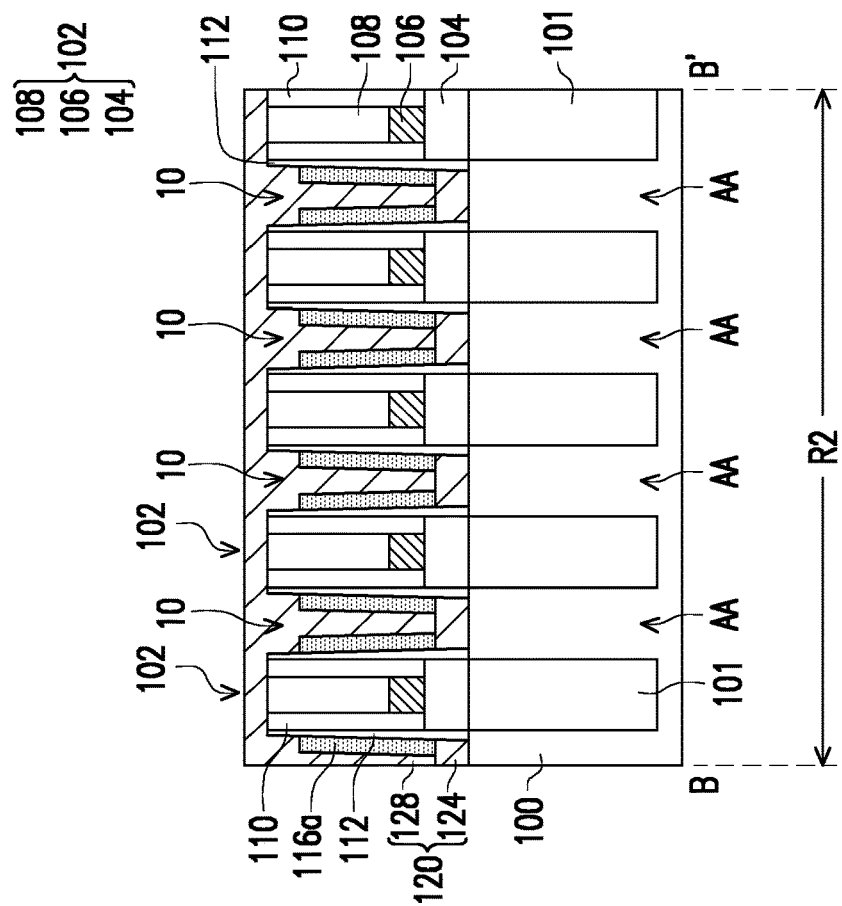
Figure 2G:
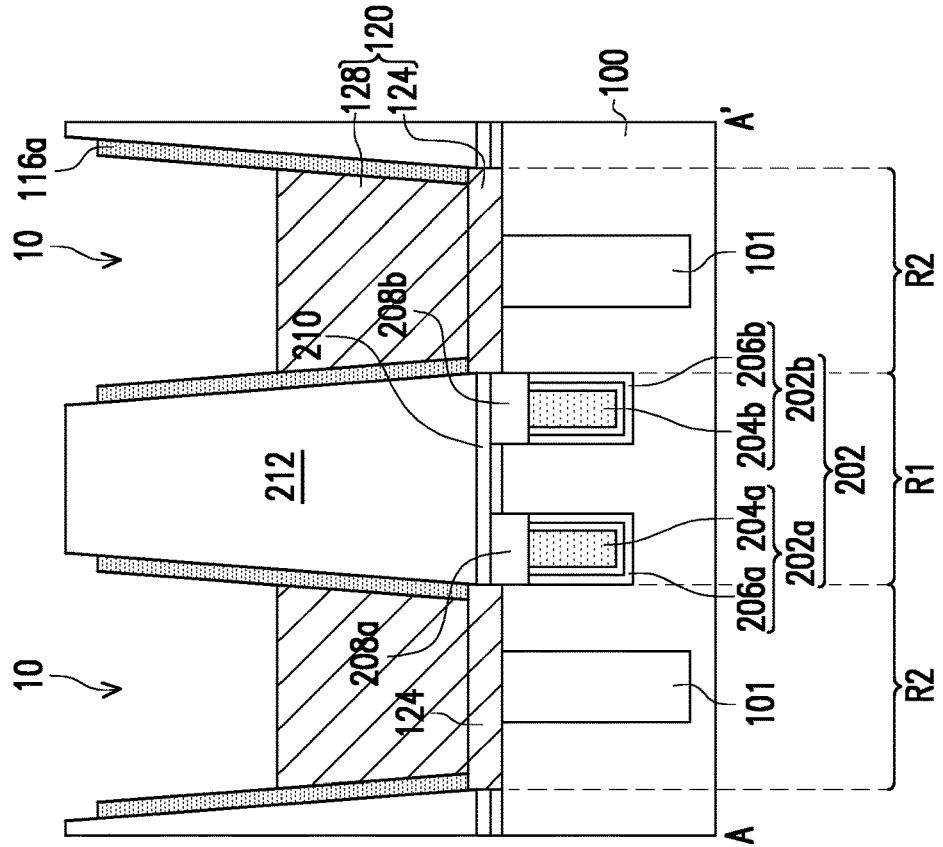

Referring to FIGS. 2F to 2G and FIGS. 3F to 3G, the other etching back process is performed on the conductive material 118 to remove a portion of the conductive material 118, thereby forming a thinner conductive material 128 (which may be regarded as a second conductive material) in the openings 10. In this case, the conductive material 128 is formed on the conductive material 124, so as to form the conductive layer 120. The sacrificial layer 116a is disposed on the conductive material 124 and surrounds the sidewalls of the conductive material 128. As shown in FIG. 2G, the top surface of the conductive layer 120 (or the conductive material 128) is lower than the top surface of the dielectric layer 212. Moreover, as shown in FIG. 3G, the conductive material 128 is extended to cover the top surface of the bit line structures 102.

Figures 2H, 3H:
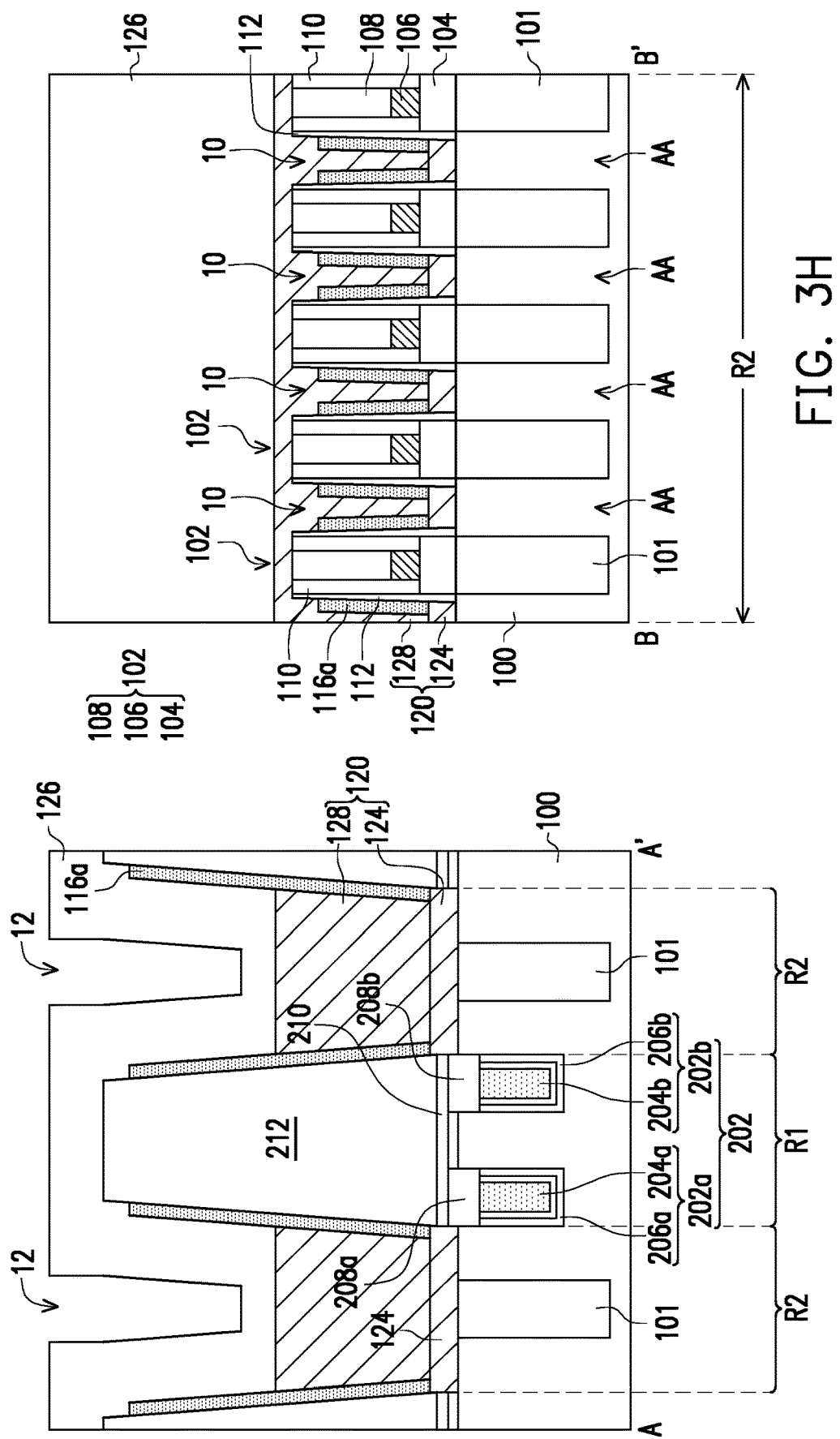
Figures 2I, 3I:
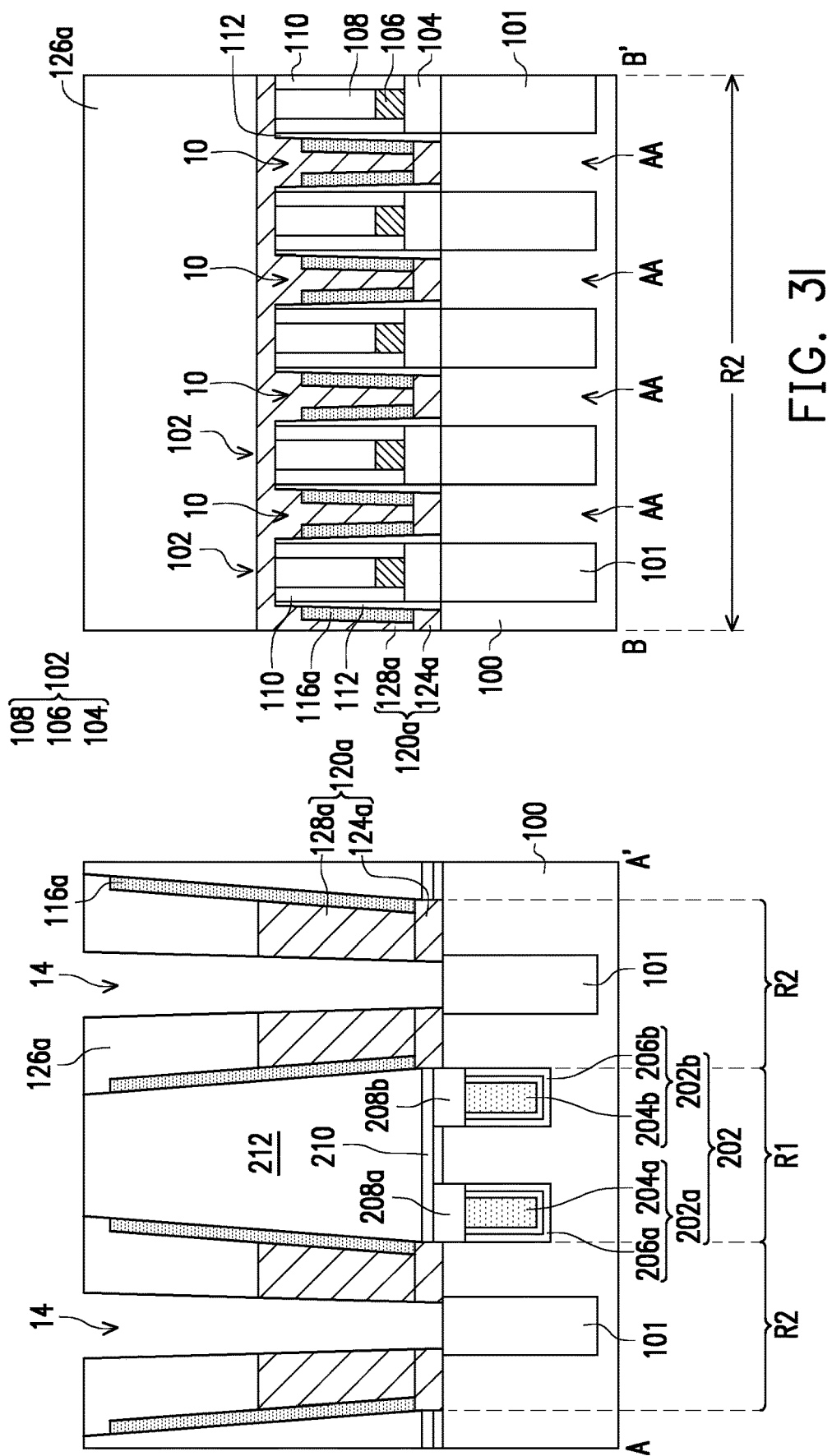

Referring to FIG. 2H and FIG. 3H, a dielectric layer 126 (which may be regarded as a second dielectric layer) is conformally formed on the substrate 100. The dielectric layer 126 conformally covers the conductive material 128 and the dielectric layer 212. Since a height difference is included between the top surface of the conductive material 128 and the top surface of the dielectric layer 212, the top surface of the dielectric layer 126 may be a continuous uneven structure, for example. In other words, the dielectric layer 126 has an uneven top surface, and the top surface of the dielectric layer 126 of the second regions R2 is lower than the top surface of the dielectric layer 126 of the first regions R1. Specifically, the dielectric layer 126 located on the dielectric layer 212 is a convex portion; and the dielectric layer 126 located on the conductive material 128 is a concave portion. As shown in FIG. 2H, the dielectric layer 126 of the second regions R2 has concave openings 12 corresponding to the insolation structures 101 in the substrate 100. In an embodiment, a material of the dielectric layer 126 may be silicon nitride, for example.

Referring to FIGS. 2H to 2I and FIGS. 3H to 3I, the openings 12 are extended to form openings 14 exposing the isolation structures 101. Specifically, an etching process is performed to remove a portion of the dielectric layer 126 and a portion of the conductive layer 120 to form the openings 14 in the conductive layer 120a and the dielectric layer 126a of the second regions R2. The openings 14 correspond to and expose the isolation structures 101 of the second regions R2. In addition, during the etching process, the dielectric layer 126 of the first regions R1 is also removed to expose the top surface of the dielectric layer 212. Further, the dielectric layer 126 of FIG. 3H is also thinned as the dielectric layer 126a of FIG. 3I. From another point of view, one conductive layer 120 are divided into two conductive layers 120a by one of the openings 14. Since the openings 14 is able to align the isolation structures 101 of the second regions R2 without performing any lithography process, the openings 14 may be considered as self-aligned openings.

Referring to FIG. 2J and FIG. 3J, a dielectric material 122 is formed on the substrate 100. The dielectric material 122 is filled in the openings 14 and covers the top surface of the dielectric layer 126a. In an embodiment, the dielectric material 122 includes silicon nitride, which may be formed by CVD.

Referring to FIGS. 2J to 2K and FIGS. 3J to 3K, a planarization process is performed to remove a portion of the dielectric material 122, a portion of the dielectric layer 212, the dielectric layer 126a, and a portion of the sacrificial layer 116a to stop on the top surface of the conductive material 128a. In an embodiment, the planarization process may be a chemical mechanical polishing (CMP) process or a blanket etching back process. In this case, as shown in FIG. 2K, dielectric pillars 132 are formed in the openings 14 (shown in FIG. 2I). The dielectric pillars 132 (which may be considered as second isolation structures) are in contact with the isolation structures 101 (which may be considered as first isolation structures) and separate the conductive layers 120a and sacrificial layers 116b on the second regions R2. In addition, in FIG. 2K, the sacrificial layer 116b is exposed by the conductive layer 120a.

Referring to FIGS. 2K to 2L and FIGS. 3K to 3L, a portion of the conductive material 128a is recessed to expose the sacrificial layer 116b between the bit line structures 102. In this case, as shown in FIG. 2L and FIG. 3L, a conductive structure 120b (which may be regarded as a first conductive structure) is formed. In particular, the conductive structure 120b includes a conductive material 124a and a conductive material 128b thereon, wherein the sacrificial layer 116b surrounds the sidewalls of the conductive material 128b. In an embodiment, the recessing the conductive material 128a includes performing a wet etching process. The wet etching process includes using an etchant having a high etch selectivity that removes most of the conductive material 128a without removing or only slightly removing the dielectric layer 212, the dielectric pillars 132, and the sacrificial layer 116b. In this case, the sacrificial layer 116b between the bit line structures 102 is exposed by the conductive structure 120b.

Referring to FIGS. 2L to 2M and FIGS. 3L to 3M, the sacrificial layer 116b is completely removed to form an air gap AG surrounding an upper portion of the conductive structure 120b (i.e., the conductive material 128b). In an embodiment, the method of completely removing the sacrificial layer 116b includes performing a wet etching process which includes using an etchant, such as hydrofluoric acid (HF), dilute hydrofluoric acid (DHF), buffered oxide etchant (BOE), or the like, for example. The etchant may remove the sacrificial layer 116b made of silicon oxide without removing or only slightly removing the dielectric layer 212 and the dielectric pillars 132.

Referring to FIGS. 2M to 2N and FIGS. 3M to 3N, another conductive structure 220 is formed on the conductive structure 120b to encapsulate the air gap AG. Specifically, the conductive structure 220 includes a barrier layer 222 and a metal layer 224, wherein the barrier layer 222 wraps the metal layer 224. In an embodiment, a material of the barrier layer 222 includes a barrier metal, which may be Ti, TiN, Ta, TaN, or a combination thereof, for example. A material of the metal layer 224 includes a metal, which may be tungsten (W), for example. In this case, as shown in FIG. 2N, the conductive structure 120b and the conductive structure 220 thereon may constitute the capacitor contacts CC. In an embodiment, the material of the conductive structure 120b is different from the material of the conductive structure 220.

It should be noted that, as shown in FIG. 2N, the conductive structure 120b includes a lower portion 124a and an upper portion 128b. In an embodiment, a bottom width of the lower portion 124a is greater than a bottom width of the upper portion 128b, as shown in FIG. 3N. In this case, the air gap AG surrounds the upper portion 128b of the conductive structure 120b, such that the cross-sectional profile of the conductive structure 120b presents an inverted T-shape. In the present embodiment, the air gap AG not only may reduce the capacitance between the bit line structures 102 and the capacitor contacts CC, but also not sacrifice the contact areas between the capacitor contacts CC and the active areas AA, thereby increasing the operating speed of the memory device 1 and increasing a reliability of the device. Moreover, in some embodiments, a bottom surface area of the dielectric pillars 132 is less than or equal to a top surface area of the isolation structures 101 to ensure maximum contact areas between the capacitor contacts CC and the active areas AA, as shown in FIG. 2N.

Figure 4:
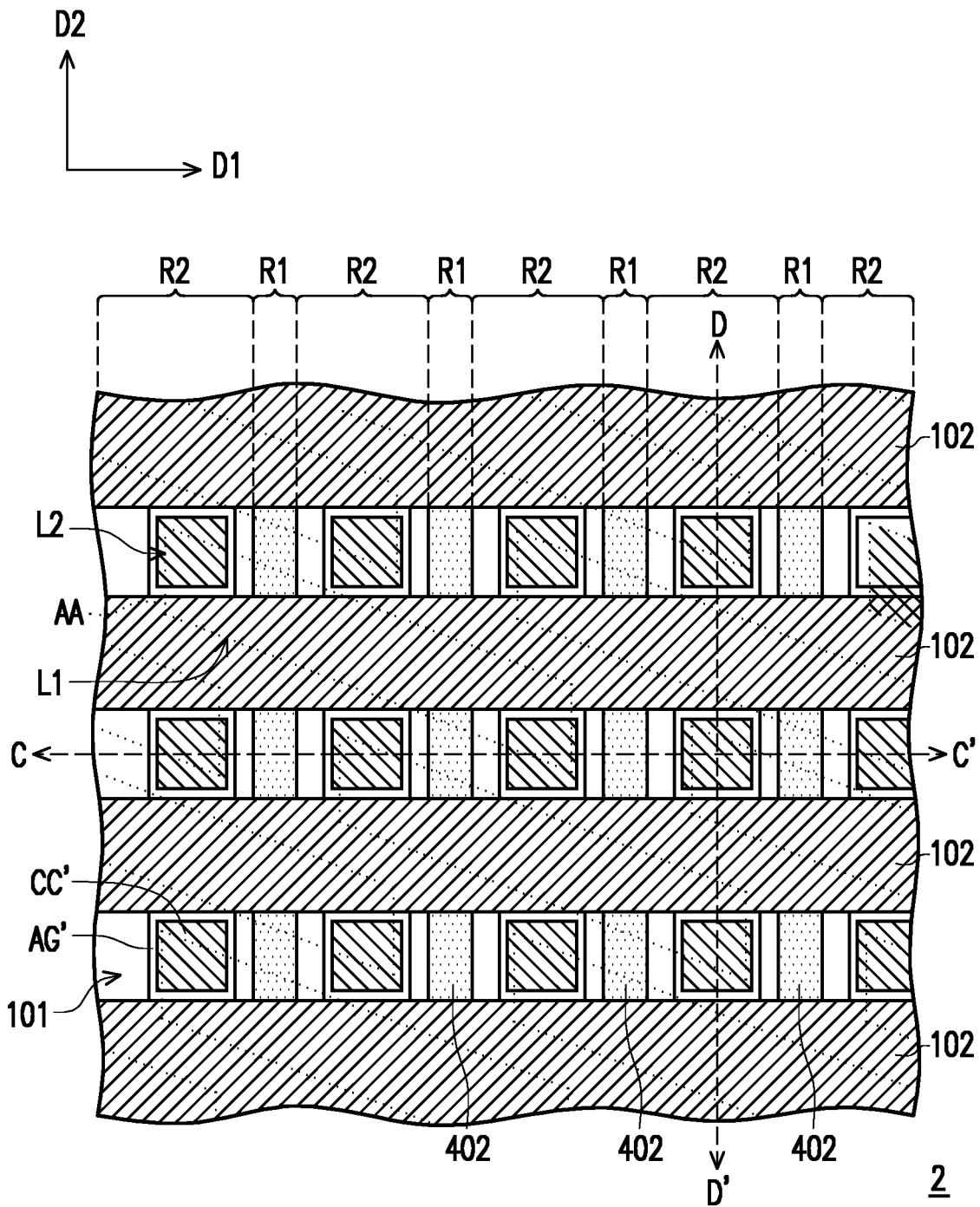
FIG. 4 is a top view of a memory device of the second embodiment of the invention.

FIG. 4 is a top view of a memory device of the second embodiment of the invention.

Referring to FIG. 4, basically, a memory device 2 of the second embodiment is similar to the memory device 1 of the first embodiment. The difference between the above two is that the long side L1 of the active area AA spans two word lines 402 from another point of view. Capacitor contacts CC' are disposed respectively on both ends of the long side L1 of the active area AA. It should be noted that the memory device 2 further includes a plurality of air gaps AG' completely surrounding the sidewalls of the capacitor contacts CC' to reduce the capacitance between the bit line structures 102 and the capacitor contacts CC' and reduce RC delay, thereby increasing the operating speed of the memory device 2.

Referring to FIG. 4, FIG. 5A, and FIG. 6A, the present embodiment provides a manufacturing method of the memory device 2 including the following steps. First, an initial structure is provided that includes a substrate 100, isolation structures 101, and a plurality of word lines 402. The isolation structures 101 are disposed in the substrate 100 to separate the substrate 100 into a plurality of active areas AA. As shown in FIG. 5A, a plurality of word lines 402 are disposed in the substrate 100 of the first regions R1. In detail, each of the word lines 402 includes a gate 404 and a gate dielectric layer 406 surrounding the gate 404. In addition, the word lines 402 outside the active areas AA are disposed in the isolation structures 101. Further, the initial structure further includes dielectric layers 408 respectively disposed on the word lines 402.

As shown in FIG. 5A, a dielectric layer 412 is formed on the substrate 100 and openings 20 (which may be considered as contact openings) are formed in the dielectric layer 412. The openings 20 are respectively disposed on two ends of the active areas AA. In addition, as shown in FIG. 6A, the openings 20 are also disposed between the bit line structures 102. In other words, the openings 20 are defined by the substrate 100, the dielectric layer 412, and the bit line structures 102.

Figure 6B:
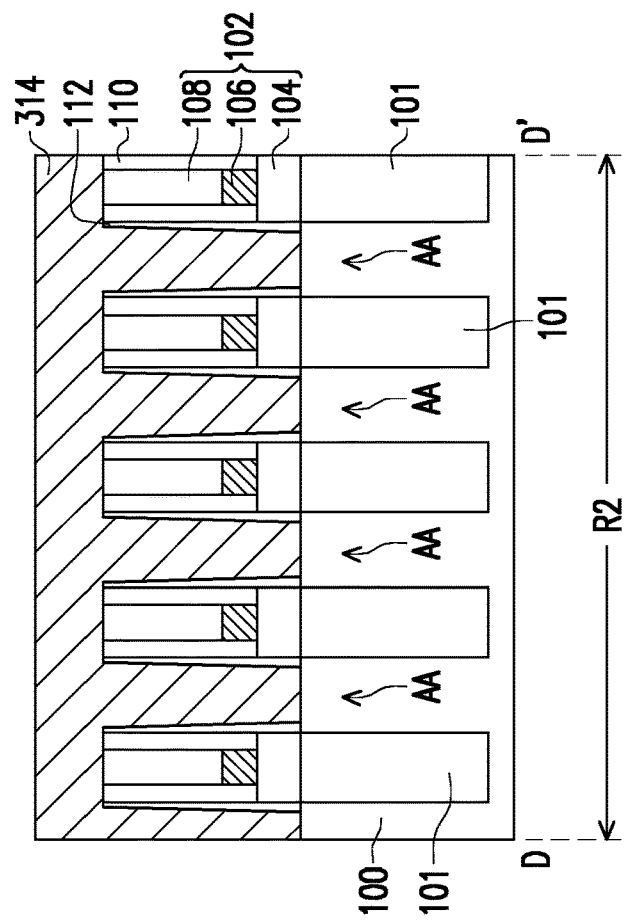
Figure 5B:
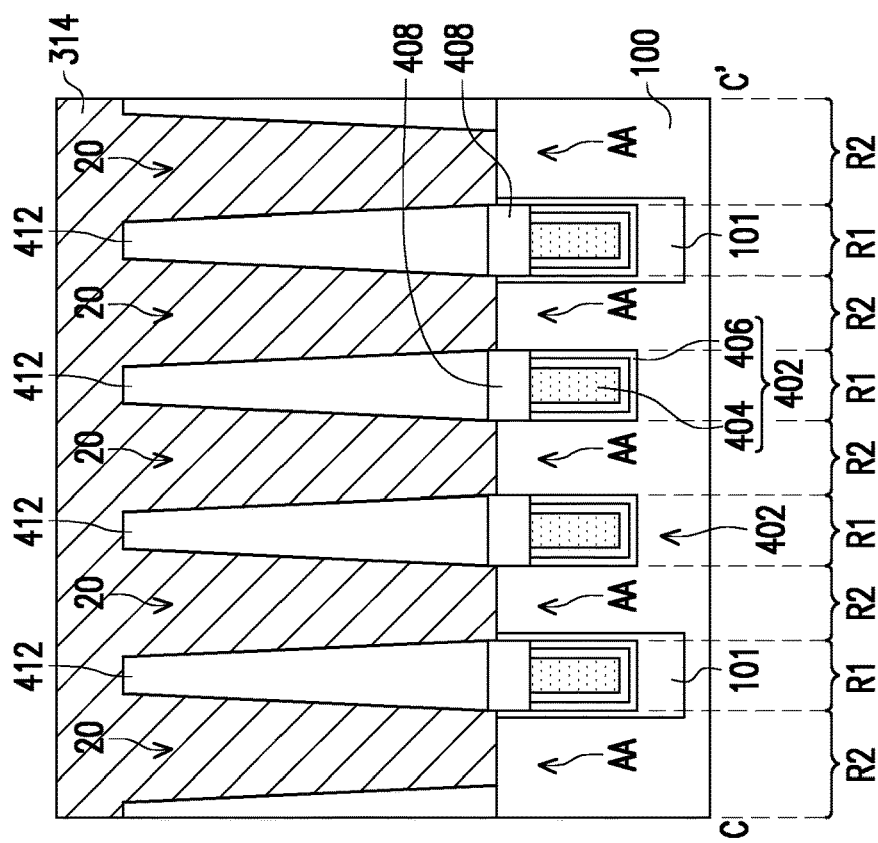
Figure 5C:
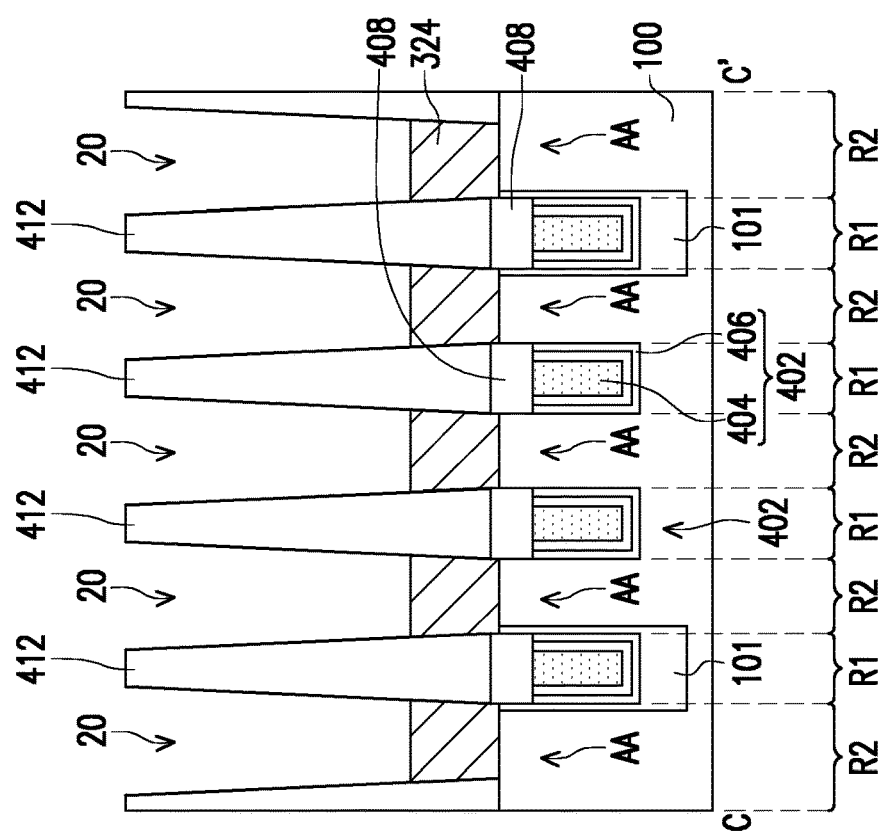

Referring to FIG. 5B and FIG. 6B, a conductive material 314 is formed on the initial structure (or the substrate 100). The conductive material 314 is filled in the openings 10 and extended to cover the top surface of the bit line structures 102 and the top surface of the dielectric layer 412.

Referring to FIGS. 5B to 5C and FIGS. 6B to 6C, an etching back process is performed to remove a portion of the conductive material 314 to form a thinner conductive material 324 (which may be regarded as a first conductive material) in the openings 20.

Figure 6C:
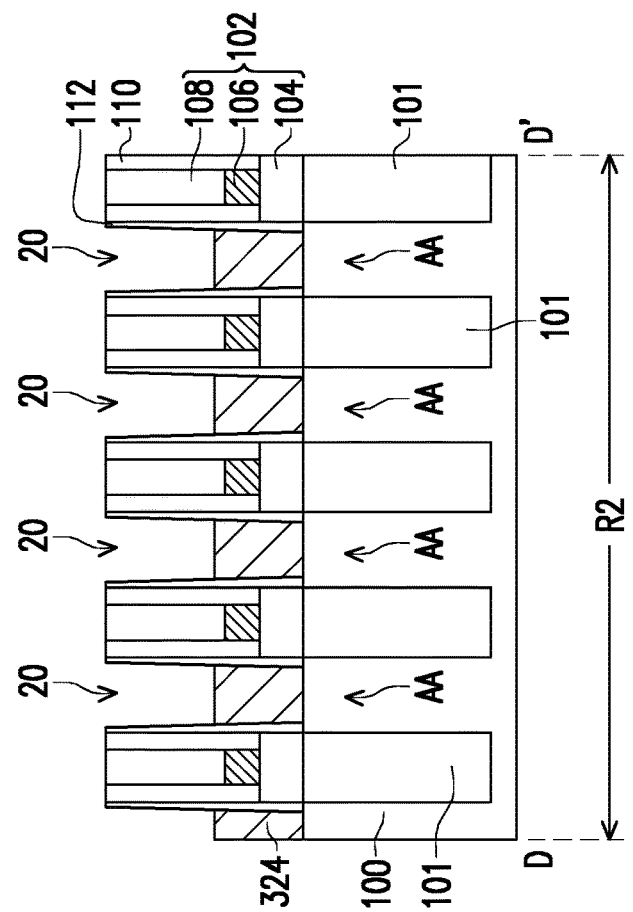
Figure 6D:
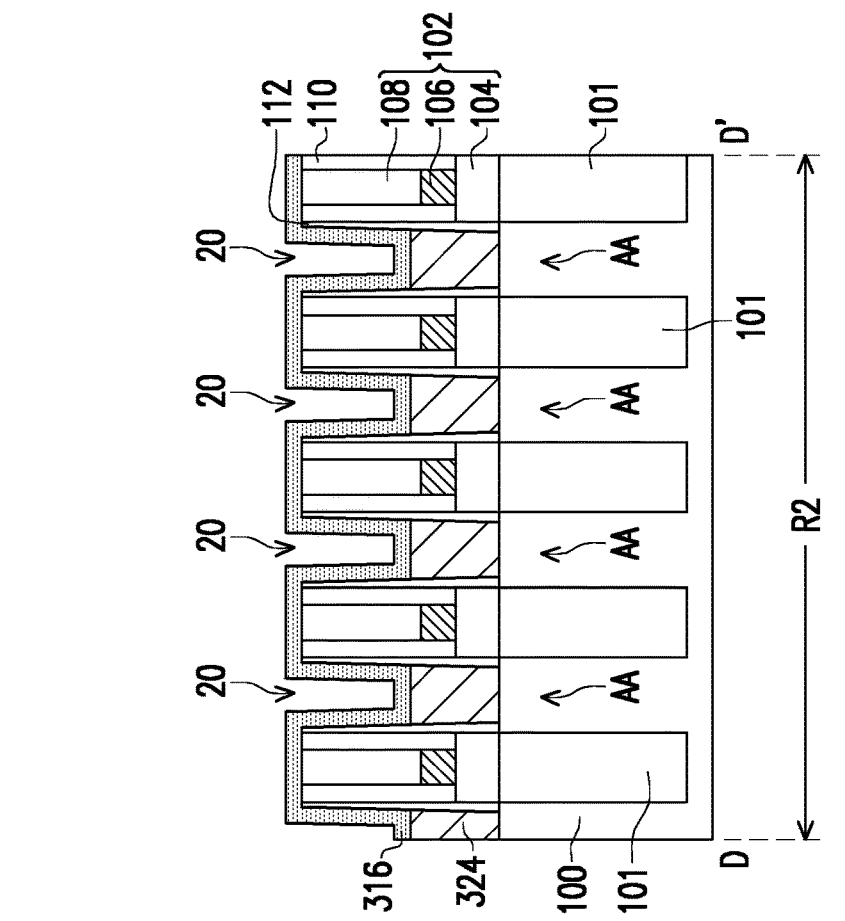
Figure 5D:
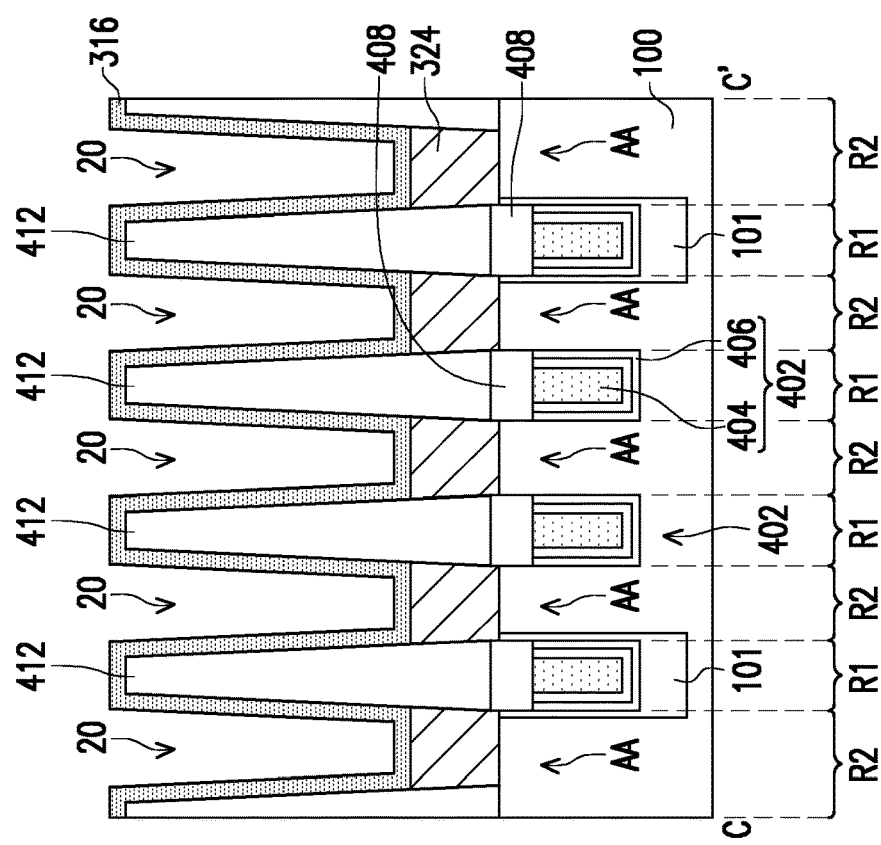

Referring to FIG. 5D and FIG. 6D, a sacrificial material 316 is formed on the substrate 100. The sacrificial material 316 conformally covers the dielectric layer 412, the bit line structures 102, and the conductive material 324.

Figures 5E, 6E:
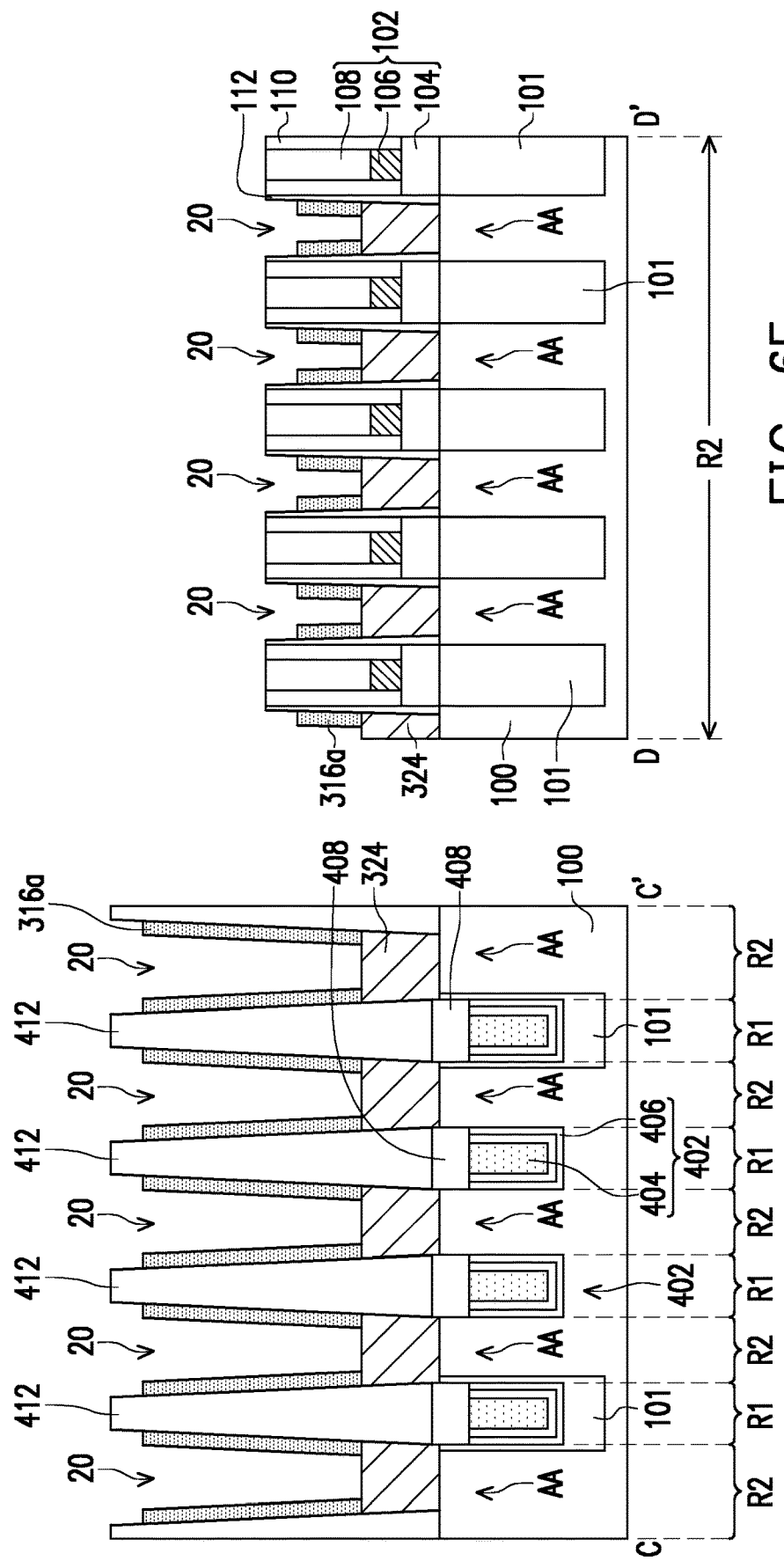

Referring to FIGS. 5D to 5E and FIGS. 6D to 6E, another etching back process is performed to remove a portion of the sacrificial material 316 to expose the top surface of the conductive material 324 and the top surface of the dielectric layer 412. In this case, as shown in FIG. 5E and FIG. 6E, a remaining sacrificial material 316a (hereinafter referred to as a sacrificial layer 316a) is disposed on the conductive material 324 and extended along the sidewalls of the openings 20.

Figure 6F:
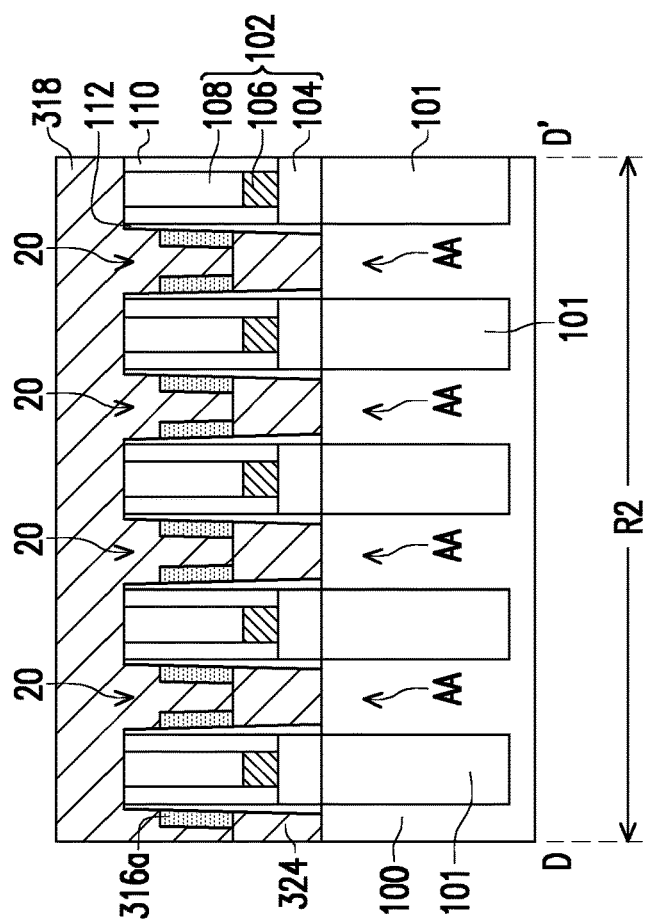
Figure 5F:
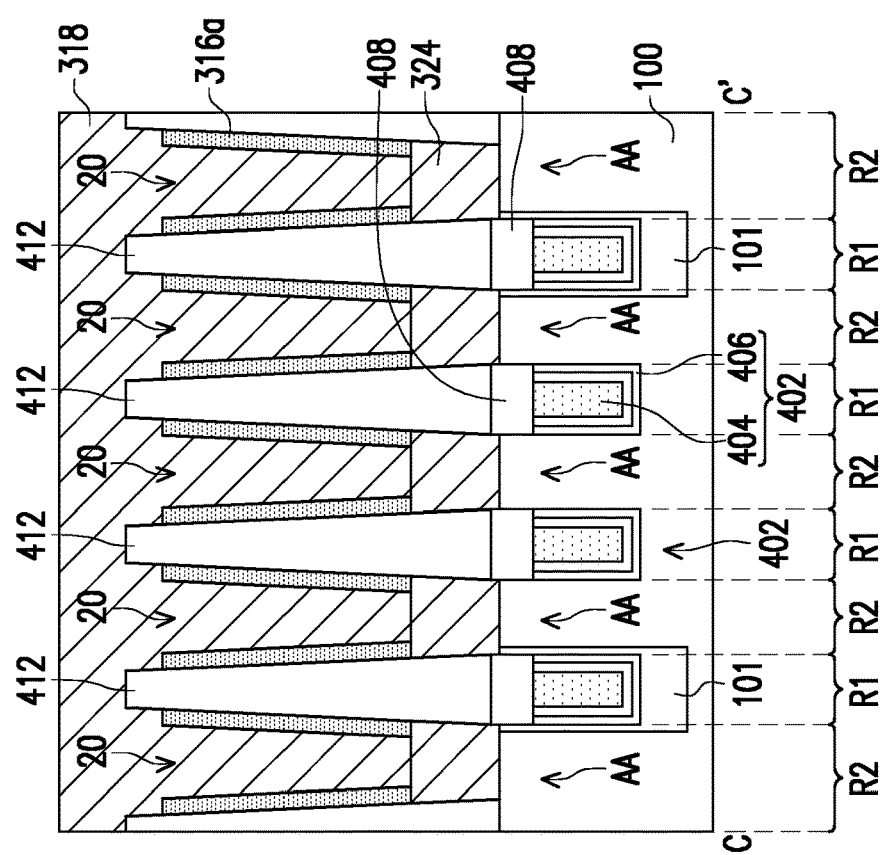

Referring to FIG. 5F and FIG. 6F, a conductive material 318 is formed on the conductive material 324. Specifically, the conductive material 318 is filled in the openings 20 and extended to cover the top surface of the bit line structures 102 and the top surface of the dielectric layer 412.

Figures 5G, 6G:
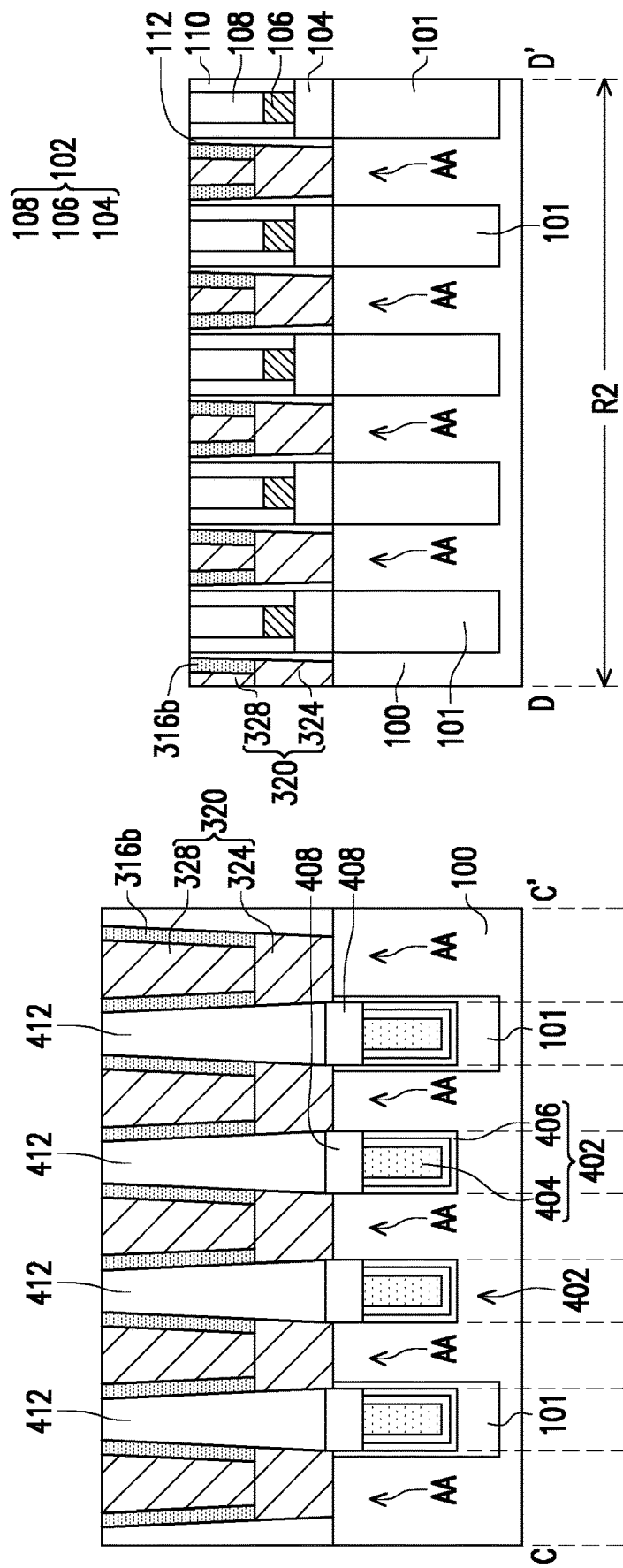
Figures 5I, 6I:
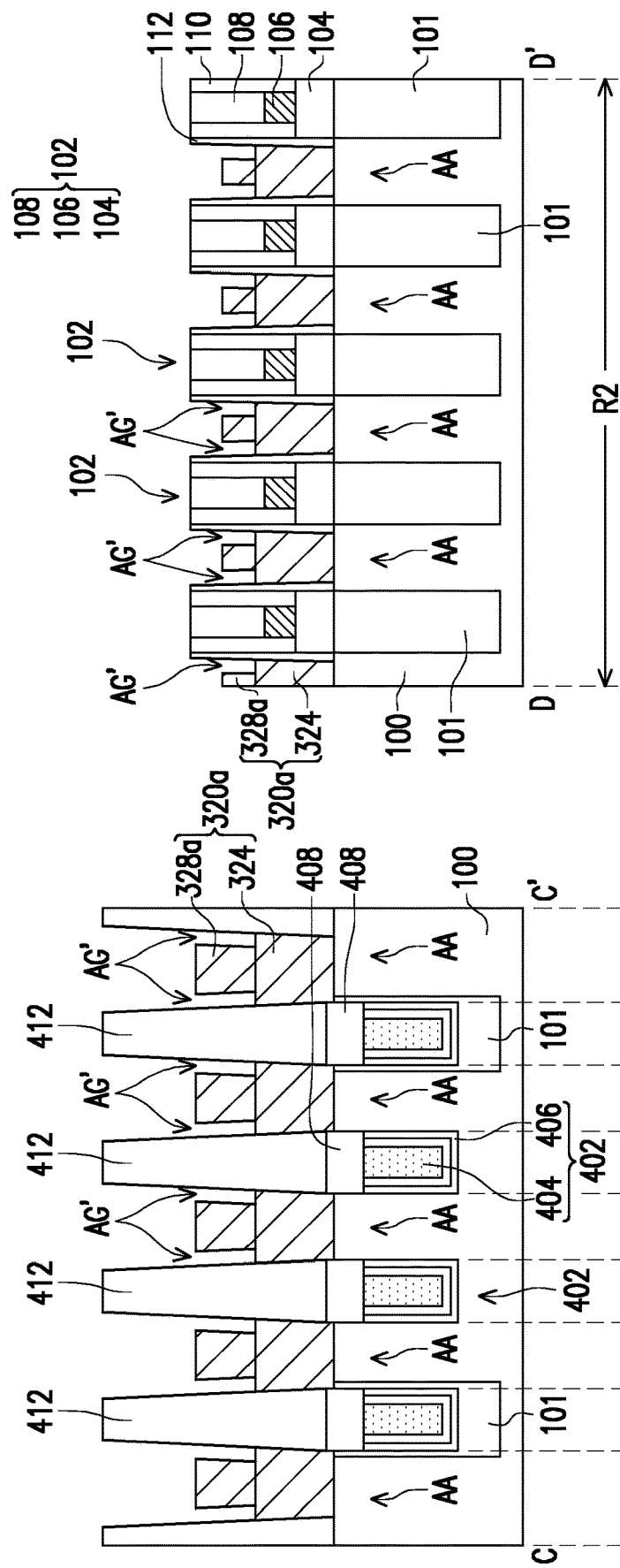

Referring to FIGS. 5F to 5G, a planarization process is performed to remove a portion of the conductive material 318, a portion of the dielectric layer 412, and a portion of the sacrificial layer 316a. In this case, a conductive material 328 is formed on the conductive material 324 to form a conductive layer 320. The sacrificial layer 316a is disposed on the conductive material 324 and surrounds the sidewalls of the conductive material 328. Additionally, as shown in FIGS. 6F to 6G, a portion of the cap layer 108, a portion of the first spacers 110, and a portion of the second spacers 112 are also removed during the planarization process. After the planarization process, as shown in FIG. 5G and FIG. 6G, a sacrificial layer 316b is exposed by the conductive layer 320 and the bit line structures 102.

Referring to FIGS. 5G to 5H and FIGS. 6G to 6H, a portion of the conductive material 328 is recessed to expose the sidewalls of the sacrificial layer 316b. In this case, as shown in FIG. 5H and FIG. 6H, a conductive structure 320a (which may be regarded as a first conductive structure) is formed. In particular, the conductive structure 320a includes a conductive material 324 and a conductive material 328a thereon, wherein the sacrificial layer 316b surrounds the sidewalls of the conductive material 328a.

Referring to FIGS. 5H to 5I and FIGS. 6H to 6I simultaneously, the sacrificial layer 316b is completely removed to form an air gap AG' completely surrounding an upper portion of the conductive structure 320a (i.e., the conductive material 328a).

Figure 6J:
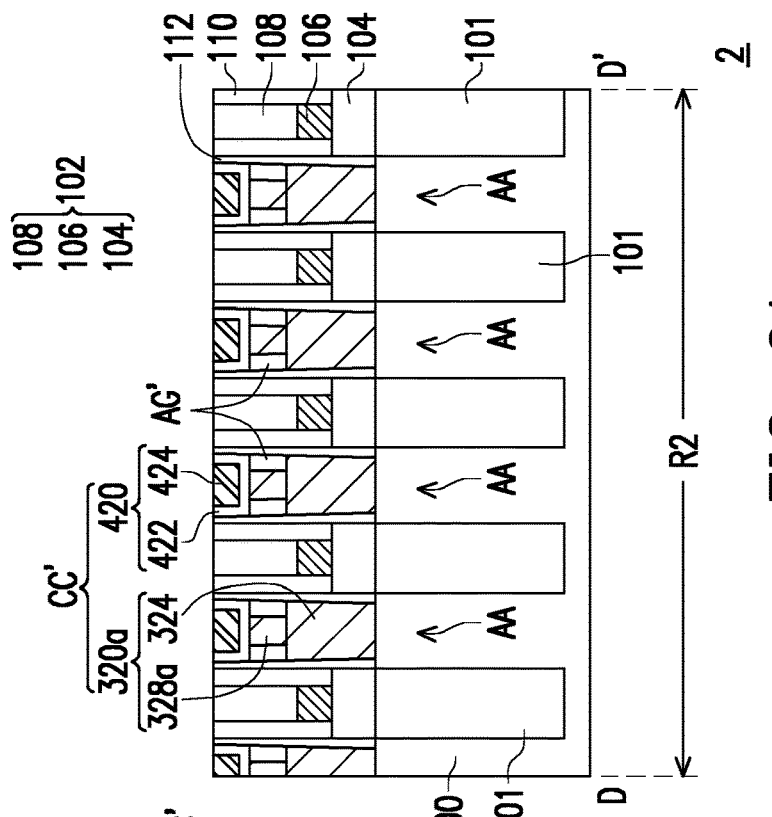
Figure 5J:
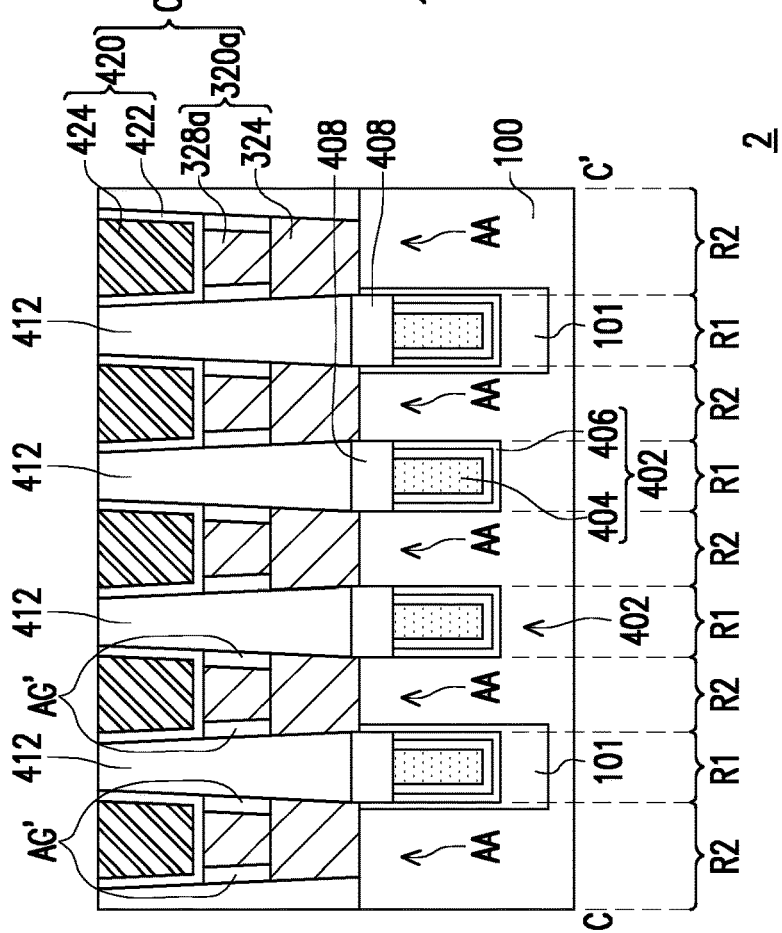

Referring to FIGS. 5I to 5J and FIGS. 6I to 6J, another conductive structure 420 is formed on the conductive structure 320a to encapsulate the air gap AG'. Specifically, the conductive structure 420 includes a barrier layer 422 and a metal layer 424, wherein the barrier layer 422 wraps the metal layer 424. In this case, as shown in FIG. 6J, the conductive structure 320a and the conductive structure 420 thereon may constitute the capacitor contacts CC'. The conductive structure 320a includes a lower portion 324 and an upper portion 328a. The air gap AG' surrounds the upper portion 328a of the conductive structure 320a, such that the cross-sectional profile of the conductive structure 320a presents an inverted T-shape. In the present embodiment, the air gap AG' not only may reduce the capacitance between the bit line structures 102 and the capacitor contacts CC', but also not sacrifice the contact areas between the capacitor contacts CC' and the active areas AA, thereby increasing the operating speed of the memory device 2 and increasing a reliability of the device.

Based on the above, the memory device of the invention includes air gaps surrounding the sidewalls of the contacts, which is able to reduce the capacitance between the bit lines and the contacts and reduce the RC delay, thereby increasing the operating speed of the memory device. In addition, in the present invention, the memory device may maintain the contact areas between the contacts and the active areas to improve a reliability of the device, while the RC delay of the memory device is reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory device, comprising:
   a substrate having a plurality of active areas;
   a plurality of contacts respectively disposed on ends of the active areas; and
   a plurality of air gaps respectively surrounding and directly contacting sidewalls of the contacts, wherein one of the plurality of air gaps surrounds at least three sidewalls of a corresponding contact,
   wherein each of the contacts comprises a first conductive structure, the first conductive structure comprises a lower portion and an upper portion, and one of the air gaps surrounds and directly contacts the upper portion of the first conductive structure and directly contacts a top surface of the lower portion of the first conductive structure, such that a cross-sectional profile of the first conductive structure presents an inverted T-shape.

2. The memory device of claim 1, wherein each of the contacts further comprises:
   a second conductive structure disposed on the first conductive structure, wherein a material of the second conductive structure is different from a material of the first conductive structure.

3. The memory device of claim 1, wherein a bottom width of the lower portion is greater than a bottom width of the upper portion.

4. The memory device of claim 1, wherein one of the air gaps completely surrounds the upper portion of the first conductive structure.

5. The memory device of claim 1, further comprising:
   a plurality of bit line structures respectively disposed between the contacts at the ends of the active areas and extended along a first direction; and
   a plurality of word lines respectively disposed between two adjacent contacts in the first direction and extended along a second direction, wherein the second direction is different from the first direction.

6. The memory device of claim 5, wherein the plurality of word lines are embedded word lines disposed in the substrate.

7. The memory device of claim 5, wherein one of the air gaps is extended between sidewalls of two adjacent bit line structures in the second direction.

8. The memory device of claim 1, further comprising:
   a plurality of isolation structures respectively disposed between two adjacent active areas in the first direction to electrically isolate the contacts on the two adjacent active areas in the first direction.

9. The memory device of claim 8, wherein the plurality of isolation structures are in contact with the plurality of air gaps respectively.

10. The memory device of claim 8, wherein one of the plurality of isolation structures comprises a first portion embedded in the substrate and a second portion disposed on the first portion.

11. The memory device of claim 10, wherein a bottom surface area of the second portion is less than or equal to a top surface area of the first portion.

12. The memory device of claim 10, wherein the other sidewall of the corresponding contact are covered by the second portion of the isolation structure.

13. The memory device of claim 1, wherein the plurality of contacts are capacitor contacts.

* * * * *